(12) United States Patent
Kogure et al.

(10) Patent No.: US 12,206,439 B2
(45) Date of Patent: Jan. 21, 2025

(54) POWER AMPLIFIER CIRCUIT, RADIO FREQUENCY CIRCUIT, COMMUNICATION DEVICE, RADIO FREQUENCY MODULE, AND AMPLIFICATION METHOD

(71) Applicant: Murata Manufacturing Co., Ltd., Nagaokakyo (JP)

(72) Inventors: Takeshi Kogure, Nagaokakyo (JP); Kenichi Shimamoto, Nagaokakyo (JP); Yoshiki Kogushi, Nagaokakyo (JP); Toshiki Matsui, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 358 days.

(21) Appl. No.: 17/818,388

(22) Filed: Aug. 9, 2022

(65) Prior Publication Data
US 2022/0385314 A1    Dec. 1, 2022

Related U.S. Application Data

(63) Continuation of application No. PCT/JP2021/004391, filed on Feb. 5, 2021.

(30) Foreign Application Priority Data

Feb. 14, 2020   (JP) ................. 2020-023194

(51) Int. Cl.
*H04B 1/04*   (2006.01)
*H03F 1/56*   (2006.01)
*H03F 3/24*   (2006.01)

(52) U.S. Cl.
CPC ................. *H04B 1/04* (2013.01); *H03F 1/56* (2013.01); *H03F 3/245* (2013.01);
(Continued)

(58) Field of Classification Search
CPC ............ H04B 1/04; H03F 3/24; H03F 3/245; H03F 1/56; H03F 2200/451; H03F 220/222; H03F 2200/387
See application file for complete search history.

(56) References Cited

U.S. PATENT DOCUMENTS 5,603,106 A * 2/1997 Toda .................. H04W 52/52
                                                    455/114.2
7,116,949 B2 * 10/2006 Irie .................... H03G 1/0088
                                                    455/73
(Continued)

FOREIGN PATENT DOCUMENTS

JP      H0394527 A     4/1991
JP      2004159221 A   6/2004
(Continued)

OTHER PUBLICATIONS

International Search Report in PCT/JP2021/004391, mailed Apr. 6, 2021, 3 pages.

*Primary Examiner* — Hai V Nguyen
(74) *Attorney, Agent, or Firm* — ArentFox Schiff LLP

(57) ABSTRACT

A power amplifier circuit is provided that includes a transmission circuit, a control circuit, a first terminal, and a second terminal. The transmission circuit includes an amplifier element that amplifies power of a radio frequency signal. The control circuit controls the transmission circuit. The first terminal receives a serial data signal that is based on a serial data standard. The second terminal receives a digital signal different from the serial data signal. The control circuit then controls the transmission circuit in response to the digital signal received from the second terminal.

20 Claims, 21 Drawing Sheets

(52) U.S. Cl.
CPC .......... *H03F 2200/222* (2013.01); *H03F 2200/387* (2013.01); *H03F 2200/451* (2013.01)

(56) References Cited

U.S. PATENT DOCUMENTS

| | | | |
|---|---|---|---|
| 7,199,652 B2 | 4/2007 | Morimoto et al. | |
| 7,321,750 B2* | 1/2008 | Bergveld | H03G 3/3042 330/297 |
| 7,564,302 B2* | 7/2009 | Zolfaghari | H03G 3/3078 330/278 |
| 7,650,122 B2* | 1/2010 | Itkin | H03G 3/3042 455/127.1 |
| 7,873,334 B2* | 1/2011 | Itkin | H03G 3/3042 455/127.1 |
| 7,937,120 B2* | 5/2011 | Blin | H03F 1/02 455/343.1 |
| 8,208,874 B2* | 6/2012 | Seymour | H03F 1/0244 330/136 |
| 8,422,968 B2* | 4/2013 | Donovan | H04B 1/04 455/553.1 |
| 8,565,699 B1* | 10/2013 | Lipshitz | H03G 3/3042 455/523 |
| 8,854,019 B1* | 10/2014 | Levesque | H02M 1/14 363/60 |
| 8,909,178 B2* | 12/2014 | Fan | H03F 1/0211 455/127.1 |
| 9,020,452 B2* | 4/2015 | Baxter | H04B 1/62 455/127.1 |
| 9,065,505 B2* | 6/2015 | Levesque | H04B 1/0475 |
| 9,106,181 B2 | 8/2015 | Ito et al. | |
| 10,056,874 B1* | 8/2018 | Ranta | H03F 1/30 |
| 10,148,338 B1* | 12/2018 | Takei | H04B 7/0842 |
| 10,165,513 B1* | 12/2018 | Gorbachov | H04B 1/40 |
| 10,686,621 B1* | 6/2020 | Frozenfar | H04L 5/001 |
| 2004/0092236 A1* | 5/2004 | Irie | H03G 1/0023 455/73 |
| 2006/0291588 A1* | 12/2006 | Irie | H04L 27/362 375/297 |
| 2008/0036532 A1* | 2/2008 | Pan | H03F 1/0266 330/51 |
| 2008/0231357 A1* | 9/2008 | Zolfaghari | H03F 3/72 330/51 |
| 2009/0160555 A1* | 6/2009 | Sun | H03F 3/217 330/273 |
| 2009/0251210 A1* | 10/2009 | Zolfaghari | H03F 3/245 330/51 |
| 2014/0285262 A1 | 9/2014 | Kojima et al. | |
| 2015/0349838 A1* | 12/2015 | Petrovic | H03G 3/34 375/221 |
| 2016/0241213 A1* | 8/2016 | Zhao | H03G 1/0088 |
| 2016/0277044 A1* | 9/2016 | Song | H03F 3/19 |
| 2017/0214418 A1* | 7/2017 | Rozek | H03F 1/025 |
| 2018/0226923 A1 | 8/2018 | Nagamori | |
| 2018/0248571 A1* | 8/2018 | Wang | H04B 1/04 |
| 2018/0262163 A1* | 9/2018 | Tokuda | G05F 3/26 |
| 2018/0262166 A1* | 9/2018 | Takagi | H03F 3/245 |
| 2018/0262220 A1* | 9/2018 | Jimenez | H04B 1/04 |
| 2018/0287647 A1* | 10/2018 | Morishita | H04B 1/16 |
| 2019/0007240 A1* | 1/2019 | Jiang | H03F 3/245 |
| 2020/0169232 A1* | 5/2020 | Goto | H03F 3/245 |
| 2020/0344534 A1* | 10/2020 | Luo | H04Q 11/0067 |
| 2023/0072796 A1* | 3/2023 | Kogure | H03F 3/245 |
| 2023/0075733 A1* | 3/2023 | Kogure | H03F 3/19 |
| 2024/0006774 A1* | 1/2024 | Cho | H01Q 3/267 |
| 2024/0235485 A1* | 7/2024 | Kogure | H03F 1/0233 |
| 2024/0267012 A1* | 8/2024 | Itou | H04B 1/40 |

FOREIGN PATENT DOCUMENTS

| | | |
|---|---|---|
| JP | 2005176331 A | 6/2005 |
| JP | 2007005996 A | 1/2007 |
| JP | 2008288977 A | 11/2008 |
| JP | 2014183463 A | 9/2014 |
| JP | 2018129711 A | 8/2018 |
| WO | 2013176147 A1 | 11/2013 |

* cited by examiner

POWER AMPLIFIER CIRCUIT, RADIO FREQUENCY CIRCUIT, COMMUNICATION DEVICE, RADIO FREQUENCY MODULE, AND AMPLIFICATION METHOD

CROSS REFERENCE TO RELATED APPLICATIONS

This application is a continuation of PCT Application No. PCT/JP2021/004391, filed Feb. 5, 2021, which claims priority to Japanese Patent Application No. 2020-023194, filed Feb. 14, 2020, the entire contents of each of which are hereby incorporated by reference in their entirety.

TECHNICAL FIELD

The present invention generally relates to power amplifier (PA) circuits, radio frequency (RF) circuits, communication devices, RF modules, and amplification methods, and more specifically relates to a PA circuit that amplifies the power of an RF signal, an RF circuit including the PA circuit, a communication device including the RF circuit, an RF module that amplifies the power of the RF module, and an amplification method for amplifying the power of an RF signal.

BACKGROUND

In recent years, PA circuits employing an envelope tracking method (hereinafter referred to as an "ET method") have been known (see, for example, International Publication No. 2003/176147). The ET method is an RF amplification technique that changes the amplitude of the power supply voltage for an amplifier element in accordance with the amplitude of the envelope of an RF signal. More specifically, the ET method is a technique for changing the collector voltage of an amplifier element in accordance with an output voltage, thereby reducing power loss generated during operation when the power supply voltage is fixed, and achieving higher efficiency.

The PA circuit described in International Publication No. 2003/176147 includes a transistor that amplifies a signal input to the base and outputs the amplified signal from the collector. The PA circuit changes the power supply voltage for the transistor in accordance with the amplitude of the envelope of an RF signal, and supplies the power supply voltage to the transistor.

With the increase in frequencies of RF signals, there has been a demand for PA circuits that work with RF signals having higher frequencies. However, the PA circuit described in International Publication No. 2003/176147 involves an issue that it is difficult for the operation of a transmission circuit including an amplifier element to follow amplitude variations of an RF signal when the amplitude variations are rapid.

SUMMARY OF THE INVENTION

Accordingly, it is an object of the present invention to provide a PA circuit, an RF circuit, a communication device, an RF module, and an amplification method that reduce power consumption while working with high frequencies.

In an exemplary aspect, a power amplifier circuit is provided that includes a transmission circuit, a control circuit, a first terminal, and a second terminal. The transmission circuit includes an amplifier element that is configured to amplify power of a radio frequency signal. The control circuit is configured to control the transmission circuit. The first terminal is configured to receive a serial data signal that is based on a serial data transmission standard. The second terminal is configured to receive a digital signal different from the serial data signal. The control circuit is configured to control the transmission circuit in response to the digital signal received from the second terminal.

Moreover, in an exemplary aspect, a radio frequency circuit is provided that includes the power amplifier circuit, an antenna terminal, and a filter. The filter is disposed in a path extending between the power amplifier circuit and the antenna terminal.

In another exemplary aspect, a communication device is provided that includes the radio frequency circuit and a signal processing circuit. The signal processing circuit is configured to output the radio frequency signal to the transmission circuit.

In yet another exemplary aspect, a radio frequency module is provided that includes a mounting substrate, a power amplifier, a control circuit, a first terminal, and a second terminal. The power amplifier is configured to amplify power of a radio frequency signal. The control circuit is configured to control the power amplifier. The first terminal is configured to receive a serial data signal that is based on a serial data transmission standard. The second terminal is configured to receive a digital signal different from the serial data signal and the control circuit is configured to perform control in response to the digital signal received from the second terminal.

Yet further, an amplification method is provided that includes receiving a power supply voltage through a power supply line, amplifying a radio frequency signal by using the power supply voltage, and receiving a digital signal different from a serial data signal. The serial data signal is a signal based on a serial data transmission standard.

With the power amplifier circuit, the radio frequency circuit, the communication device, the radio frequency module, and the amplification method according to the above-described exemplary aspects of the present invention, power consumption can be reduced while dealing with high frequencies.

DETAILED DESCRIPTION OF THE EMBODIMENTS

Hereinafter, power amplifier (PA) circuits, radio frequency (RF) circuits, and communication devices according to first to fifth exemplary embodiments, and RF modules according to sixth and seventh exemplary embodiments will be described with reference to the drawings. The individual figures referred to in the following embodiments and the like are schematic diagrams. It is noted that the ratios of the sizes and thicknesses of the individual components in the figures do not necessarily reflect the actual dimensional ratios according to the exemplary aspects.

First Exemplary Embodiment (1) PA Circuit

The configurations of a PA circuit 1 and an RF circuit 6 according to the first exemplary embodiment will be described with reference to the drawings.

Figure 1:
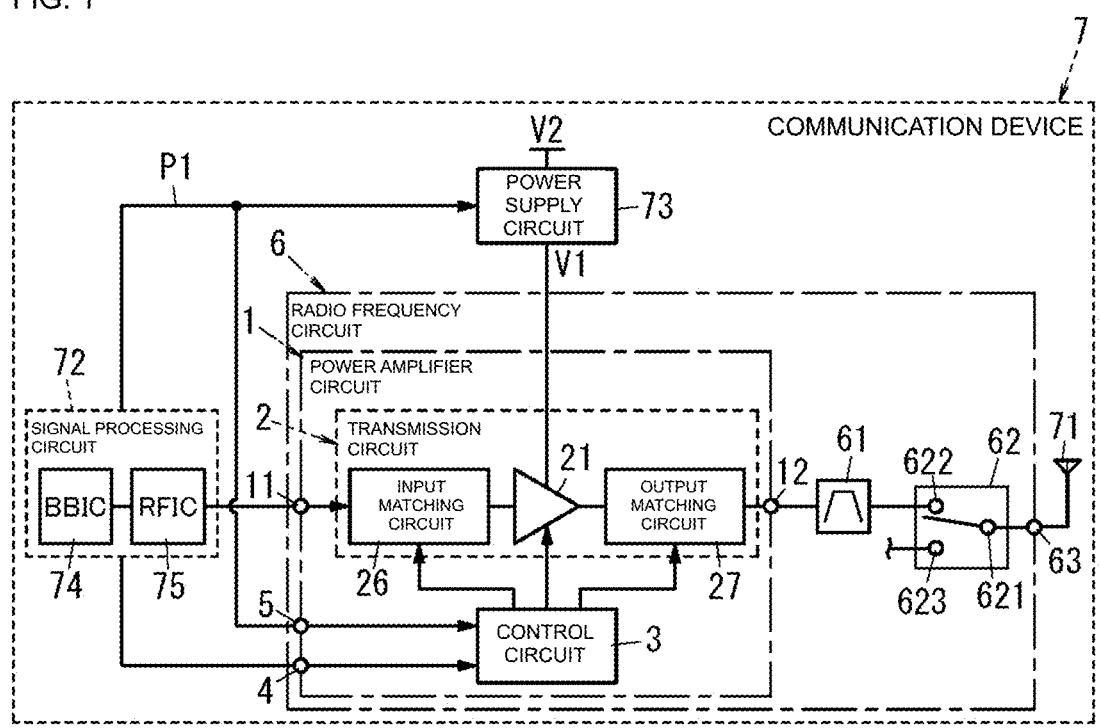
FIG. 1 is a conceptual diagram illustrating the configurations of a power amplifier (PA) circuit, a radio frequency (RF) circuit, and a communication device according to a first exemplary embodiment.

As illustrated in FIG. 1, the PA circuit 1 according to the first embodiment includes a transmission circuit 2 and a control circuit 3. The PA circuit 1 also includes an input terminal 11, an output terminal 12, a first terminal 4, and a second terminal 5.

In operation, the PA circuit 1 is an amplifier circuit that amplifies the power of an RF signal output from an RF signal processing circuit 75, which will be described below, to a level needed for transmitting the RF signal to a base station (not illustrated), and outputs the amplified RF signal.

To amplify the RF signal, an envelope tracking method (hereinafter referred to as an "ET method") is used. The ET method includes an analog envelope tracking method (hereinafter referred to as an "analog ET method") and a digital envelope tracking method (hereinafter referred to as a "digital ET method").

The analog ET method is a method of continuously assigning the amplitude level of the power supply voltage for an amplifier element in accordance with the envelope of the amplitude of an RF signal input to the amplifier element. In the analog ET method, the envelope is continuously detected, and thus the amplitude level of the power supply voltage continuously changes.

The digital ET method is a method of discretely supplying power supply voltages in amplitude levels to an amplifier element in accordance with the envelope of the amplitude of an RF signal input to the amplifier element. In the digital ET method, the voltage level of the power supply voltage is selected from among a plurality of discrete voltage levels in response to a digital control signal corresponding to an envelope signal, and changes with time (see FIG. 4). The envelope signal is a signal indicating the envelope value of a modulated wave (RF signal). The envelope value is, for example, $(I^2+Q^2)^{1/2}$, where (I, Q) represents a constellation point. The constellation point is a point representing, on a constellation diagram, a signal modulated by digital modulation.

The PA circuit 1 according to the first embodiment is configured to amplify an RF signal by using the digital ET method. The PA circuits 1 according to the second and third embodiments are also configured to amplify an RF signal using the digital ET method.

(2) RF Circuit

Hereinafter, the RF circuit 6 employing the PA circuit 1 will be described with reference to the drawings.

As illustrated in FIG. 1, the RF circuit 6 includes the PA circuit 1, a filter 61, a switch 62, and an antenna terminal 63. In operation, an RF signal output from the RF circuit 6 is transmitted to a base station (not illustrated) via an antenna 71, which will be described below. The RF circuit 6 serves as an RF module and is used for a communication device 7 or the like, which will be described below.

(2.1) Filter

As illustrated in FIG. 1, the filter 61 is a transmission filter that allows an RF signal in a specific communication band to pass therethrough. The filter 61 is disposed, in a transmission path, between a transistor 21 described below of the PA circuit 1 and the antenna terminal 63. More specifically, the filter 61 is disposed between the output terminal 12 of the PA circuit 1 and the switch 62. The filter 61 passes an RF signal having power amplified by the transistor 21 of the PA circuit 1 and output from the PA circuit 1. The transmission path is a path that connects the input terminal 11 of the PA circuit 1 and the antenna terminal 63 for transmitting an RF signal from the antenna 71.

The filter 61 is not limited to a transmission filter, and may be a duplexer including both a transmission filter and a reception filter, or may be a multiplexer including three or more filters according to various exemplary aspects.

(2.2) Switch

As illustrated in FIG. 1, the switch 62 is a switch for switching the path to be connected to the antenna terminal 63. In other words, the switch 62 is a switch for switching the filter to be connected to the antenna terminal 63 among a plurality of filters including the filter 61.

The switch 62 has a common terminal 621 and a plurality of (e.g., two in the illustrated example) selection terminals 622 and 623. The common terminal 621 is connected to the antenna terminal 63. The selection terminal 622 is connected to the filter 61. The selection terminal 623 is connected to another filter (not illustrated) different from the filter 61.

The switch 62 is, for example, configured for connecting any one of the plurality of selection terminals 622 and 623 to the common terminal 621. The switch 62 is, for example, a switch integrated circuit (IC). The switch 62 is, for example, controlled by a signal processing circuit 72, which will be described below. The switch 62 switches the connection state between the common terminal 621 and the plurality of selection terminals 622 and 623 in response to a control signal from the RF signal processing circuit 75 of the signal processing circuit 72. Moreover, the switch 62 may be a switch configured for simultaneously connecting the plurality of selection terminals 622 and 623 to the common terminal 621. In this case, the switch 62 is a switch configured for one-to-many connection (direct mapping switch).

(2.3) Antenna Terminal

As illustrated in FIG. 1, the antenna terminal 63 is a terminal connected to the antenna 71, which will be described below. An RF signal from the RF circuit 6 is output to the antenna 71 via the antenna terminal 63. Although not illustrated, an RF signal from the antenna 71 is output to the RF circuit 6 via the antenna terminal 63. The antenna terminal 63 is a terminal through which an RF signal passes.

(3) Communication Device

Hereinafter, the communication device 7 employing the RF circuit 6 will be described with reference to the drawings.

As illustrated in FIG. 1, the communication device 7 includes the RF circuit 6, the antenna 71, the signal processing circuit 72, and a power supply circuit 73.

(3.1) Signal Processing Circuit

In the exemplary aspect, the signal processing circuit 72 includes a baseband signal processing circuit 74 and the RF signal processing circuit 75. The signal processing circuit 72 outputs an RF signal to the transmission circuit 2.

The baseband signal processing circuit 74 is, for example, a baseband integrated circuit (BBIC), and performs signal processing on an RF signal. The RF signal has a frequency of around several hundred MHz to several GHz, for example.

The baseband signal processing circuit 74 generates an I-phase signal and a Q-phase signal from a baseband signal. The baseband signal is, for example, an audio signal, an image signal, or the like received from the outside. The baseband signal processing circuit 74 combines the I-phase signal and the Q-phase signal to perform IQ modulation processing, and outputs a transmission signal. At this time, the transmission signal is generated as a modulated signal (e.g., an IQ signal), which is obtained through amplitude modulation performed on a carrier signal of a predetermined frequency in a period longer than the period of the carrier signal. The modulated signal is output as an IQ signal from the baseband signal processing circuit 74. The IQ signal is a signal whose amplitude and phase are represented on an IQ plane. Moreover, the IQ signal has a frequency of around several MHz to several hundred MHz, for example.

As described above, an envelope signal is a signal indicating the envelope value of a modulated wave (RF signal). The envelope value is, for example, $(I^2+Q^2)^{1/2}$, where (I, Q) represents a constellation point. The constellation point is a point representing, on a constellation diagram, a signal modulated by digital modulation.

The RF signal processing circuit 75 is, for example, a radio frequency integrated circuit (RFIC), and performs signal processing on an RF signal. For example, the RF signal processing circuit 75 performs predetermined signal processing on the modulated signal (IQ signal) output from the baseband signal processing circuit 74. More specifically, the RF signal processing circuit 75 performs signal processing, such as up-conversion on the modulated signal output from the baseband signal processing circuit 74, and outputs the RF signal generated through the signal processing to the PA circuit 1. It is noted that the signal processing performed by the RF signal processing circuit 75 is not limited to direct conversion from the modulated signal into the RF signal. Moreover, the RF signal processing circuit 75 can be configured to convert the modulated signal into an intermediate frequency (IF) signal, and generate an RF signal from the IF signal obtained through the conversion.

The signal processing circuit 72 outputs a power supply control signal to the power supply circuit 73. The power supply control signal is a signal including information regarding amplitude variations of an RF signal, and is output from the signal processing circuit 72 to the power supply circuit 73 in order to change the amplitude of a power supply voltage V1. The power supply control signal includes, for example, an I-phase signal and a Q-phase signal.

(3.2) Power Supply Circuit

The power supply circuit 73 is a circuit that supplies the power supply voltage V1 to the PA circuit 1. More specifically, the power supply circuit 73 includes an input terminal (not illustrated) that receives a power supply control signal, and a voltage generator (not illustrated) that generates the power supply voltage V1. The input terminal is connected to the signal processing circuit 72 and receives the power supply control signal from the signal processing circuit 72. The power supply circuit 73 generates the power supply voltage V1 in response to the power supply control signal received by the input terminal. At this time, the power supply circuit 73 changes the amplitude of the power supply voltage V1 in response to the power supply control signal from the signal processing circuit 72. In other words, the power supply circuit 73 is an envelope tracking circuit that generates the power supply voltage V1 that varies in accordance with the envelope of the amplitude of the RF signal output from the signal processing circuit 72. The power supply circuit 73 includes, for example, a direct current (DC)-DC converter, detects the amplitude level of the RF signal from the I-phase signal and the Q-phase signal, and generates the power supply voltage V1 by using the detected amplitude level.

The power supply circuit 73 is connected to, for example, a battery (not illustrated) of a terminal or the like equipped with the RF circuit 6, and is supplied with a battery voltage V2 from the battery. In operation, the power supply circuit 73 is configured to extract an envelope from the modulated signal of the RF signal, generate the power supply voltage V1 having a level corresponding to the envelope, and supply the power supply voltage V1 to the PA circuit 1.

(4) Details of Power Supply Circuit

Hereinafter, the details of the power supply circuit 73 according to the first exemplary embodiment will be described with reference to FIG. 5 and FIG. 6.

Figure 5:
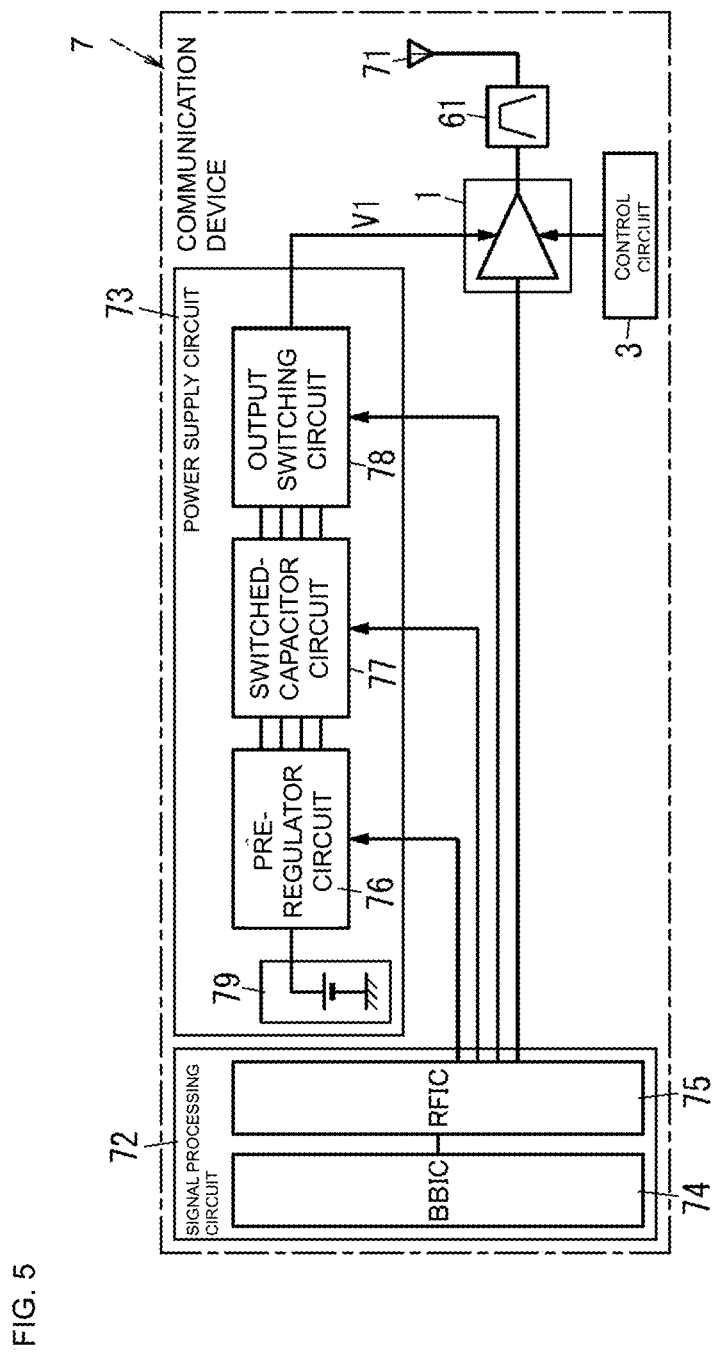
FIG. 5 is a conceptual diagram illustrating the configuration of the communication device.
Figure 6:
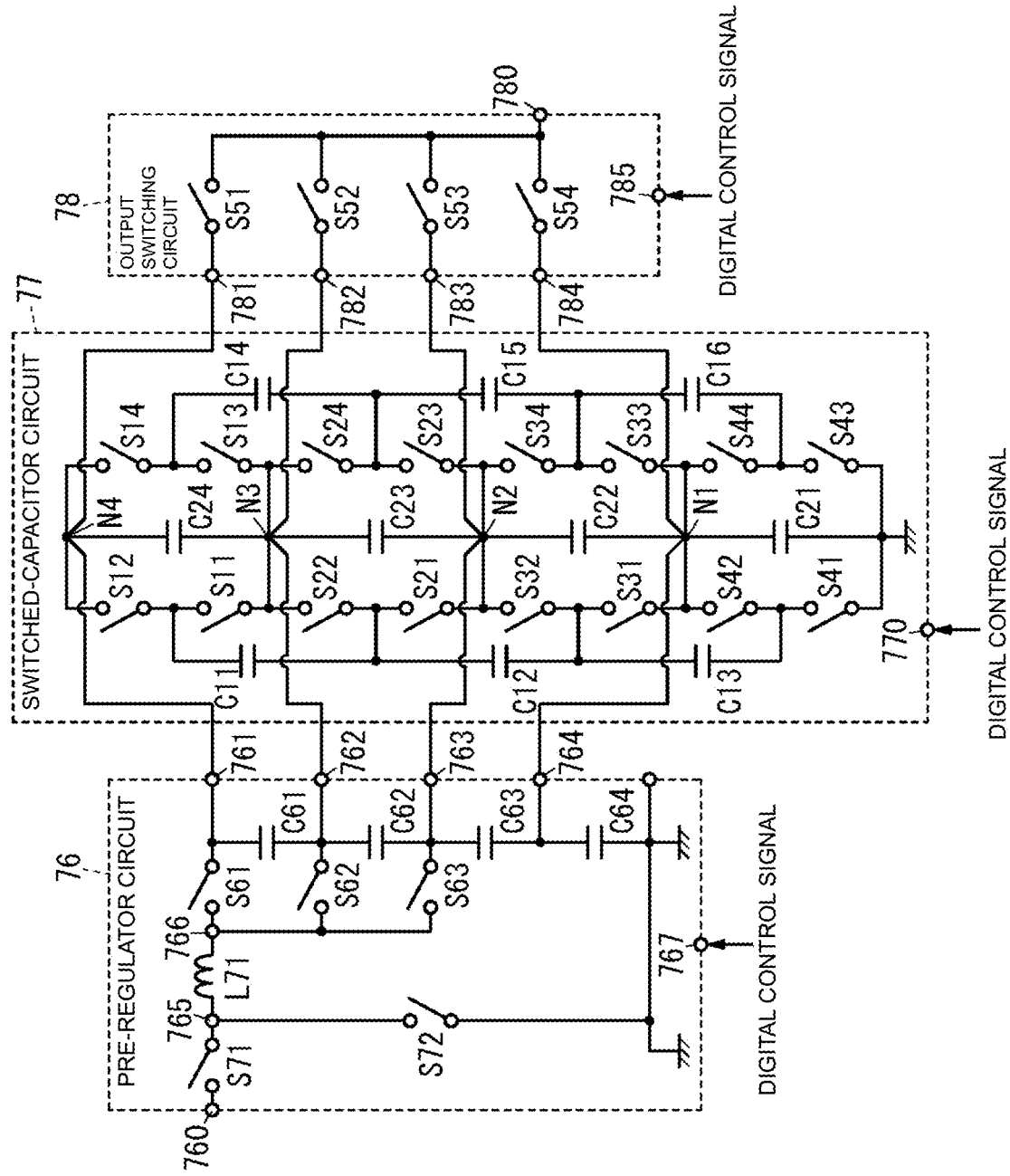
FIG. 6 is a conceptual diagram illustrating the configuration of a power supply circuit.

As illustrated in FIG. 5 and FIG. 6, the power supply circuit 73 includes a pre-regulator circuit 76, a switched-capacitor circuit 77, an output switching circuit 78, and a DC power supply 79.

The power supply circuit 73 supplies the PA circuit 1 with the power supply voltage V1 having a power supply voltage level selected from among a plurality of discrete voltage levels in response to an envelope signal.

The pre-regulator circuit 76 includes a power inductor and switches. The power inductor is an inductor used to raise and/or lower (e.g., raise, lower, or raise and lower) a DC voltage. The power inductor is disposed in series in a DC path. The pre-regulator circuit 76 converts a voltage by using the power inductor and may also be referred to as a magnetic regulator or a DC-DC converter. Alternatively, the power inductor may be connected between a series-arm path and the ground (i.e., disposed in parallel) according to an exemplary aspect.

The pre-regulator circuit 76 does not necessarily need to include the power inductor, and may be, for example, a circuit or the like that raises and/or lowers (e.g., raises, lowers, or raises and lowers) a voltage by switching between capacitors disposed in a series-arm path and a parallel-arm path of the pre-regulator circuit 76.

As further shown, the switched-capacitor circuit 77 includes a plurality of capacitors and a plurality of switches, and is configured to generate a plurality of voltages respectively having a plurality of discrete voltage levels from the voltage output from the pre-regulator circuit 76. The switched-capacitor circuit 77 may also be referred to as a switched-capacitor voltage balancer.

The output switching circuit 78 selects, in response to a digital control signal corresponding to the envelope signal, at least one of the plurality of voltages generated by the switched-capacitor circuit 77, and outputs the selected voltage to the PA circuit 1.

The DC power supply 79 supplies a DC voltage to the pre-regulator circuit 76. The DC power supply 79 may be, and is not limited to, a rechargeable battery, for example.

It is noted that the power supply circuit 73 does not necessarily need to include at least one of the pre-regulator circuit 76 and the DC power supply 79. For example, the power supply circuit 73 does not necessarily need to include the DC power supply 79. Any combination of the pre-regulator circuit 76, the switched-capacitor circuit 77, and the output switching circuit 78 may be integrated into a single circuit. A detailed circuit configuration example of the power supply circuit 73 will be described below with reference to FIG. 6.

(4.1) Circuit Configuration of Power Supply Circuit

Hereinafter, the circuit configurations of the pre-regulator circuit 76, the switched-capacitor circuit 77, and the output switching circuit 78 included in the power supply circuit 73 will be described with reference to FIG. 6.

FIG. 6 illustrates an exemplary circuit configuration. The pre-regulator circuit 76, the switched-capacitor circuit 77, and the output switching circuit 78 may be mounted by using any one of a wide variety of circuit packaging methods and circuit techniques as would be appreciated to one skilled in the art. Thus, the description of the individual circuits provided below should not be construed in a limiting manner.

(4.2) Switched-Capacitor Circuit

As illustrated in FIG. 6, the switched-capacitor circuit 77 includes a plurality of (e.g., six in the illustrated example) capacitors C11 to C16, a plurality of (e.g., four in the illustrated example) capacitors C21 to C24, a plurality of (e.g., sixteen in the illustrated example) switches S11 to S14, S21 to S24, S31 to S34, and S41 to S44, and a control terminal 770.

The control terminal 770 is an input terminal for a digital control signal. More specifically, the control terminal 770 is a terminal for receiving a digital control signal for controlling the switched-capacitor circuit 77. The digital control signal received via the control terminal 770 is, for example, a control signal of a source synchronous scheme in which a data signal and a clock signal are transmitted. The digital control signal is not limited to the control signal of the source synchronous scheme. For example, the digital control signal may be a control signal of a clock embedded scheme.

The plurality of capacitors C11 to C16 each function as a flying capacitor (e.g., a transfer capacitor). That is, the plurality of capacitors C11 to C16 are each used to raise or lower the voltage supplied from the pre-regulator circuit 76. More specifically, the plurality of capacitors C11 to C16 cause electric charges to move between the capacitors C11 to C16 and nodes N1 to N4 so that voltages V41 to V44 (voltages with respect to the ground potential) satisfying $V41:V42:V43:V44=1:2:3:4$ are maintained at the four nodes N1 to N4. The plurality of voltages V41 to V44 correspond to a plurality of voltages respectively having a plurality of discrete voltage levels. The voltage V41 is the voltage at the node N1, the voltage V42 is the voltage at the node N2, the voltage V43 is the voltage at the node N3, and the voltage V44 is the voltage at the node N4.

The capacitor C11 has two electrodes (first electrode and second electrode). One of the two electrodes (first electrode) of the capacitor C11 is connected to one terminal (first terminal) of the switch S11 and one terminal (first terminal) of the switch S12. Likewise, the other of the two electrodes (second electrode) of the capacitor C11 is connected to one terminal (first terminal) of the switch S21 and one terminal (first terminal) of the switch S22.

The capacitor C12 has two electrodes (first electrode and second electrode). One of the two electrodes (first electrode) of the capacitor C12 is connected to the one terminal (first terminal) of the switch S21 and the one terminal (first terminal) of the switch S22. Likewise, the other of the two electrodes (second electrode) of the capacitor C12 is connected to one terminal (first terminal) of the switch S31 and one terminal (first terminal) of the switch S32.

Moreover, the capacitor C13 has two electrodes (first electrode and second electrode). One of the two electrodes (first electrode) of the capacitor C13 is connected to the one terminal (first terminal) of the switch S31 and the one terminal (first terminal) of the switch S32. Likewise, the other of the two electrodes (second electrode) of the capacitor C13 is connected to one terminal (first terminal) of the switch S41 and one terminal (first terminal) of the switch S42.

The capacitor C14 has two electrodes (first electrode and second electrode). One of the two electrodes (first electrode) of the capacitor C14 is connected to one terminal (first terminal) of the switch S13 and one terminal (first terminal)

of the switch S14. Likewise, the other of the two electrodes (second electrode) of the capacitor C14 is connected to one terminal (first terminal) of the switch S23 and one terminal (first terminal) of the switch S24.

The capacitor C15 has two electrodes (first electrode and second electrode). One of the two electrodes (first electrode) of the capacitor C15 is connected to the one terminal (first terminal) of the switch S23 and the one terminal (first terminal) of the switch S24. Likewise, the other of the two electrodes (second electrode) of the capacitor C15 is connected to one terminal (first terminal) of the switch S33 and one terminal (first terminal) of the switch S34.

The capacitor C16 has two electrodes (first electrode and second electrode). One of the two electrodes (first electrode) of the capacitor C16 is connected to the one terminal (first terminal) of the switch S33 and the one terminal (first terminal) of the switch S34. Likewise, the other of the two electrodes (second electrode) of the capacitor C16 is connected to one terminal (first terminal) of the switch S43 and one terminal (first terminal) of the switch S44.

According to the exemplary configuration, a set of the capacitors C11 and C14, a set of the capacitors C12 and C15, and a set of the capacitors C13 and C16 can be charged and discharged in a complementary manner as a result of the following first phase and second phase being repeated.

Specifically, in the first phase, the switches S12, S13, S22, S23, S32, S33, S42, and S43 are turned ON. Accordingly, for example, the one of the two electrodes (first electrode) of the capacitor C12 is connected to the node N3, the other of the two electrodes (second electrode) of the capacitor C12 and the one of the two electrodes (first electrode) of the capacitor C15 are connected to the node N2, and the other of the two electrodes (second electrode) of the capacitor C15 is connected to the node N1.

On the other hand, in the second phase, the switches S11, S14, S21, S24, S31, S34, S41, and S44 are turned ON. Accordingly, for example, the one of the two electrodes (first electrode) of the capacitor C15 is connected to the node N3, the other of the two electrodes (second electrode) of the capacitor C15 and the one of the two electrodes (first electrode) of the capacitor C12 are connected to the node N2, and the other of the two electrodes (second electrode) of the capacitor C12 is connected to the node N1.

As a result of the first phase and the second phase being repeated, for example, when one of the capacitors C12 and C15 is charged through the node N2, the other of the capacitors C12 and C15 can be discharged to the capacitor C23. In short, the capacitors C12 and C15 can be charged and discharged in a complementary manner. The capacitors C12 and C15 serve as a pair of flying capacitors that are charged and discharged in a complementary manner.

Similarly to the set of the capacitors C12 and C15, a set of any one of the capacitors C11 to C13 and any one of the capacitors C14 to C16 also serves as a pair of flying capacitors that are charged through the node and discharged to a smoothing capacitor in a complementary manner as a result of appropriate switching.

The plurality of capacitors C21 to C24 each function as a smoothing capacitor. Specifically, the capacitors C21 to C24 are used to hold and smooth the voltages V41 to V44 at the nodes N1 to N4.

The capacitor C21 is connected between the node N1 and the ground. Specifically, one of the two electrodes (first electrode) of the capacitor C21 is connected to the node N1. On the other hand, the other of the two electrodes (second electrode) of the capacitor C21 is connected to the ground.

The capacitor C22 is connected between the node N2 and the node N1. Specifically, one of the two electrodes (first electrode) of the capacitor C22 is connected to the node N2. On the other hand, the other of the two electrodes (second electrode) of the capacitor C22 is connected to the node N1.

The capacitor C23 is connected between the node N3 and the node N2. Specifically, one of the two electrodes (first electrode) of the capacitor C23 is connected to the node N3. On the other hand, the other of the two electrodes (second electrode) of the capacitor C23 is connected to the node N2.

The capacitor C24 is connected between the node N4 and the node N3. Specifically, one of the two electrodes (first electrode) of the capacitor C24 is connected to the node N4. On the other hand, the other of the two electrodes (second electrode) of the capacitor C24 is connected to the node N3.

The switch S11 is connected between the one of the two electrodes (first electrode) of the capacitor C11 and the node N3. Specifically, the one terminal (first terminal) of the switch S11 is connected to the one of the two electrodes of the capacitor C11. On the other hand, the other terminal (second terminal) of the switch S11 is connected to the node N3.

The switch S12 is connected between the one of the two electrodes (first electrode) of the capacitor C11 and the node N4. Specifically, the one terminal (first terminal) of the switch S12 is connected to the one of the two electrodes of the capacitor C11. On the other hand, the other terminal (second terminal) of the switch S12 is connected to the node N4.

The switch S21 is connected between the one of the two electrodes (first electrode) of the capacitor C12 and the node N2. Specifically, the one terminal (first terminal) of the switch S21 is connected to the one of the two electrodes of the capacitor C12 and the other of the two electrodes (second electrode) of the capacitor C11. On the other hand, the other terminal (second terminal) of the switch S21 is connected to the node N2.

The switch S22 is connected between the one of the two electrodes (first electrode) of the capacitor C12 and the node N3. Specifically, the one terminal (first terminal) of the switch S22 is connected to the one of the two electrodes of the capacitor C12 and the other of the two electrodes (second electrode) of the capacitor C11. On the other hand, the other terminal (second terminal) of the switch S22 is connected to the node N3.

The switch S31 is connected between the other of the two electrodes (second electrode) of the capacitor C12 and the node N1. Specifically, the one terminal (first terminal) of the switch S31 is connected to the other of the two electrodes of the capacitor C12 and the one of the two electrodes (first electrode) of the capacitor C13. On the other hand, the other terminal (second terminal) of the switch S31 is connected to the node N1.

The switch S32 is connected between the other of the two electrodes (second electrode) of the capacitor C12 and the node N2. Specifically, the one terminal (first terminal) of the switch S32 is connected to the other of the two electrodes of the capacitor C12 and the one of the two electrodes (first electrode) of the capacitor C13. On the other hand, the other terminal (second terminal) of the switch S32 is connected to the node N2. That is, the other terminal of the switch S32 is connected to the other terminal (second terminal) of the switch S21.

The switch S41 is connected between the other of the two electrodes (second electrode) of the capacitor C13 and the ground. Specifically, the one terminal (first terminal) of the switch S41 is connected to the other of the two electrodes (second electrode) of the capacitor C13. On the other hand, the other terminal (second terminal) of the switch S41 is connected to the ground.

The switch S42 is connected between the other of the two electrodes (second electrode) of the capacitor C13 and the node N1. Specifically, the one terminal (first terminal) of the switch S42 is connected to the other of the two electrodes (second electrode) of the capacitor C13. On the other hand, the other terminal (second terminal) of the switch S42 is connected to the node N1. That is, the other terminal of the switch S42 is connected to the other terminal (second terminal) of the switch S31.

The switch S13 is connected between the one of the two electrodes (first electrode) of the capacitor C14 and the node N3. Specifically, the one terminal (first terminal) of the switch S13 is connected to the one of the two electrodes (first electrode) of the capacitor C14. On the other hand, the other terminal (second terminal) of the switch S13 is connected to the node N3. That is, the other terminal of the switch S13 is connected to the other terminal (second terminal) of the switch S11 and the other terminal (second terminal) of the switch S22.

The switch S14 is connected between the one of the two electrodes (first electrode) of the capacitor C14 and the node N4. Specifically, the one terminal (first terminal) of the switch S14 is connected to the one of the two electrodes (first electrode) of the capacitor C14. On the other hand, the other terminal (second terminal) of the switch S14 is connected to the node N4. That is, the other terminal of the switch S14 is connected to the other terminal (second terminal) of the switch S12.

The switch S23 is connected between the one of the two electrodes (first electrode) of the capacitor C15 and the node N2. Specifically, the one terminal (first terminal) of the switch S23 is connected to the one of the two electrodes (first electrode) of the capacitor C15 and the other of the two electrodes (second electrode) of the capacitor C14. On the other hand, the other terminal (second terminal) of the switch S23 is connected to the node N2. That is, the other terminal of the switch S23 is connected to the other terminal (second terminal) of the switch S21 and the other terminal (second terminal) of the switch S32.

The switch S24 is connected between the one of the two electrodes (first electrode) of the capacitor C15 and the node N3. Specifically, the one terminal (first terminal) of the switch S24 is connected to the one of the two electrodes (first electrode) of the capacitor C15 and the other of the two electrodes (second electrode) of the capacitor C14. On the other hand, the other terminal (second terminal) of the switch S24 is connected to the node N3. That is, the other terminal of the switch S24 is connected to the other terminal (second terminal) of the switch S11, the other terminal (second terminal) of the switch S22, and the other terminal (second terminal) of the switch S13.

The switch S33 is connected between the other of the two electrodes (second electrode) of the capacitor C15 and the node N1. Specifically, the one terminal (first terminal) of the switch S33 is connected to the other of the two electrodes (second electrode) of the capacitor C15 and the one of the two electrodes (first electrode) of the capacitor C16. On the other hand, the other terminal (second terminal) of the switch S33 is connected to the node N1. That is, the other terminal of the switch S33 is connected to the other terminal (second terminal) of the switch S31 and the other terminal (second terminal) of the switch S42.

The switch S34 is connected between the other of the two electrodes (second electrode) of the capacitor C15 and the node N2. Specifically, the one terminal (first terminal) of the switch S34 is connected to the other of the two electrodes (second electrode) of the capacitor C15 and the one of the two electrodes (first electrode) of the capacitor C16. On the other hand, the other terminal (second terminal) of the switch S34 is connected to the node N2. That is, the other terminal of the switch S34 is connected to the other terminal (second terminal) of the switch S21, the other terminal (second terminal) of the switch S32, and the other terminal (second terminal) of the switch S23.

The switch S43 is connected between the other of the two electrodes (second electrode) of the capacitor C16 and the ground. Specifically, the one terminal (first terminal) of the switch S43 is connected to the other of the two electrodes (second electrode) of the capacitor C16. On the other hand, the other terminal (second terminal) of the switch S43 is connected to the ground.

The switch S44 is connected between the other of the two electrodes (second electrode) of the capacitor C16 and the node N1. Specifically, the one terminal (first terminal) of the switch S44 is connected to the other of the two electrodes (second electrode) of the capacitor C16. On the other hand, the other terminal (second terminal) of the switch S44 is connected to the node N1. That is, the other terminal of the switch S44 is connected to the other terminal (second terminal) of the switch S31, the other terminal (second terminal) of the switch S42, and the other terminal (second terminal) of the switch S33.

According to the exemplary aspect, a first set of switches including the switches S12, S13, S22, S23, S32, S33, S42, and S43, and a second set of switches including the switches S11, S14, S21, S24, S31, S34, S41, and S44 are turned ON and OFF in a complementary manner. Specifically, in the first phase, the switches in the first set are turned ON whereas the switches in the second set are turned OFF. Conversely, in the second phase, the switches in the first set are turned OFF whereas the switches in the second set are turned ON.

For example, in one of the first phase and the second phase, charging from the capacitors C11 to C13 to the capacitors C21 to C24 is performed, and in the other of the first phase and the second phase, charging from the capacitors C14 to C16 to the capacitors C21 to C24 is performed. In other words, because the capacitors C21 to C24 are constantly charged by the capacitors C11 to C13 or the capacitors C14 to C16, the nodes N1 to N4 are rapidly replenished with electric charges even if currents rapidly flow from the nodes N1 to N4 to the output switching circuit 78. Thus, potential variations at the nodes N1 to N4 can be suppressed.

As a result of operating in the above-described manner, the switched-capacitor circuit 77 is configured to maintain substantially equal voltages across each of the capacitors C21 to C24. Specifically, the voltages V41 to V44 (voltages with respect to the ground potential) satisfying V41:V42: V43:V44=1:2:3:4 are maintained at the four nodes N1 to N4. The levels of the voltages V41 to V44 correspond to a plurality of discrete voltage levels supplied to the output switching circuit 78 by the switched-capacitor circuit 77.

It is noted that the voltage ratio V41:V42:V43:V44 is not limited to 1:2:3:4. For example, the voltage ratio V41:V42: V43:V44 may be 1:2:4:8 in an alternative aspect.

Thus, the configuration of the switched-capacitor circuit 77 illustrated in FIG. 6 is an example, and the configuration of the switched-capacitor circuit 77 is not limited to the configuration illustrated in FIG. 6. In FIG. 6, the switched-capacitor circuit 77 is configured for supplying voltages of four discrete voltage levels, but the configuration thereof is not limited to the configuration of supplying voltages of four discrete voltage levels. The switched-capacitor circuit 77 may be configured to supply voltages of any number of two or more discrete voltage levels. For example, in a case where voltages of two discrete voltage levels are supplied, it is sufficient that the switched-capacitor circuit 77 include at least the capacitors C12 and C15 and the switches S21, S22, S31, S32, S23, S24, S33, and S34.

The switches included in the switched-capacitor circuit 77 are included in a tracker component (not illustrated). Specifically, the tracker component includes the plurality of switches S11 to S14, S21 to S24, S31 to S34, and S41 to S44.

(4.3) Output Switching Circuit

Hereinafter, the circuit configuration of the output switching circuit 78 will be described. As illustrated in FIG. 6, the output switching circuit 78 includes a plurality of (four in the illustrated example) input terminals 781 to 784, a plurality of (four in the illustrated example) switches S51 to S54, an output terminal 780, and a control terminal 785.

The output terminal 780 is connected to the PA circuit 1 (see FIG. 1). The output terminal 780 is a terminal for supplying the PA circuit 1 with a voltage selected from among the voltages V41 to V44.

The plurality of input terminals 781 to 784 are connected to the nodes N4 to N1 of the switched-capacitor circuit 77, respectively. The plurality of input terminals 781 to 784 are terminals for receiving the voltages V44 to V41 from the switched-capacitor circuit 77, respectively.

The control terminal 785 is an input terminal for a digital control signal. Specifically, the control terminal 785 is a terminal for receiving a digital control signal indicating one of the voltages V41 to V44. The output switching circuit 78 controls ON/OFF of the plurality of switches S51 to S54 so as to select a voltage level indicated by the digital control signal.

The digital control signal received via the control terminal 785 includes, for example, two digital control logic/line (DCL) signals. The two DCL signals are each a 1-bit signal. One of the voltages V41 to V44 is indicated by a combination of the two 1-bit signals. For example, the voltages V41, V42, V43, and V44 are indicated by "00", "01", "10", and "11", respectively. A gray code may be used to express a voltage level. In the above case, two control terminals are provided to receive the two DCL signals. The number of DCL signals may be any number greater than or equal to one in accordance with the number of voltage levels. The DCL signal may be a signal of two or more bits. The digital control signal may be one or more DCL signals, or may be a control signal of the source synchronous scheme.

The switch S51 is connected between the input terminal 781 and the output terminal 780. Specifically, the switch S51 has a first terminal connected to the input terminal 781 and a second terminal connected to the output terminal 780. In this connection configuration, ON/OFF switching of the switch S51 enables switching between connection and disconnection between the input terminal 781 and the output terminal 780.

The switch S52 is connected between the input terminal 782 and the output terminal 780. Specifically, the switch S52 has a first terminal connected to the input terminal 782 and a second terminal connected to the output terminal 780. In this connection configuration, ON/OFF switching of the switch S52 enables switching between connection and disconnection between the input terminal 782 and the output terminal 780.

The switch S53 is connected between the input terminal 783 and the output terminal 780. Specifically, the switch S53 has a first terminal connected to the input terminal 783 and a second terminal connected to the output terminal 780. In this connection configuration, ON/OFF switching of the switch S53 enables switching between connection and disconnection between the input terminal 783 and the output terminal 780.

The switch S54 is connected between the input terminal 784 and the output terminal 780. Specifically, the switch S54 has a first terminal connected to the input terminal 784 and a second terminal connected to the output terminal 780. In this connection configuration, ON/OFF switching of the switch S54 enables switching between connection and disconnection between the input terminal 784 and the output terminal 780.

Moreover, the plurality of switches S51 to S54 are controlled so as to be exclusively turned ON. In other words, only any one of the switches S51 to S54 is turned ON, and the others are turned OFF. Accordingly, the output switching circuit 78 is configured for outputting one voltage selected from among the voltages V41 to V44.

With the above-described configuration, the output switching circuit 78 receives a digital control signal corresponding to an envelope signal through the control terminal 785, controls ON/OFF of the plurality of switches S51 to S54 in response to the digital control signal received through the control terminal 785, and selects at least one of the plurality of voltages V41 to V44 generated by the switched-capacitor circuit 77. The output switching circuit 78 outputs the selected voltage.

The configuration of the output switching circuit 78 illustrated in FIG. 6 is an example and it is noted that the configuration of the output switching circuit 78 is not limited to the configuration illustrated in FIG. 6. In particular, the switches S51 to S54 may have any configuration as long as any one of the four input terminals 781 to 784 can be selected and connected to the output terminal 780. For example, the output switching circuit 78 may further include a switch connected between a set of the switches S51 to S53 and a set of the switch S54 and the output terminal 780. For example, the output switching circuit 78 may further include a switch connected between a set of the switches S51 and S52 and a set of the switches S53 and S54 and the output terminal 780.

For example, in the case of selecting one voltage from among second voltages of two discrete voltage levels, it is sufficient that the output switching circuit 78 include at least the switches S52 and S53.

The output switching circuit 78 may be configured for outputting two or more voltages. In this case, it is sufficient that the output switching circuit 78 further include a necessary number of additional switch sets similar to the set of the switches S51 to S54 and additional output terminals.

The switches included in the output switching circuit 78 are included in the tracker component (not illustrated). Specifically, the tracker component includes the plurality of switches S51 to S54.

(4.4) Pre-Regulator Circuit

Hereinafter, the circuit configuration of the pre-regulator circuit 76 will be described. As illustrated in FIG. 6, the pre-regulator circuit 76 includes an input terminal 760, a plurality of (four in the illustrated example) output terminals 761 to 764, a plurality of inductor connection terminals 765 and 766, a control terminal 767, a plurality of (five in the illustrated example) switches S61, S62, S63, S71, and S72, a power inductor L71, and a plurality of capacitors C61, C62, C63, and C64.

The input terminal 760 is an input terminal for a DC voltage. Specifically, the input terminal 760 is a terminal for receiving an input voltage from the DC power supply 79 (see FIG. 5).

The output terminal 761 is an output terminal for the voltage V44. Specifically, the output terminal 761 is a terminal for supplying the voltage V44 to the switched-capacitor circuit 77. The output terminal 761 is connected to the node N4 of the switched-capacitor circuit 77.

The output terminal 762 is an output terminal for the voltage V43. Specifically, the output terminal 762 is a terminal for supplying the voltage V43 to the switched-capacitor circuit 77. The output terminal 762 is connected to the node N3 of the switched-capacitor circuit 77.

The output terminal 763 is an output terminal for the voltage V42. Specifically, the output terminal 763 is a terminal for supplying the voltage V42 to the switched-capacitor circuit 77. The output terminal 763 is connected to the node N2 of the switched-capacitor circuit 77.

The output terminal 764 is an output terminal for the voltage V41. Specifically, the output terminal 764 is a terminal for supplying the voltage V41 to the switched-capacitor circuit 77. The output terminal 764 is connected to the node N1 of the switched-capacitor circuit 77.

The inductor connection terminal 765 is connected to one end (first end) of the power inductor L71. The inductor connection terminal 766 is connected to the other end (second end) of the power inductor L71.

The control terminal 767 is an input terminal for a digital control signal. Specifically, the control terminal 767 is a terminal for receiving a digital control signal for controlling the pre-regulator circuit 76.

The switch S71 is connected between the input terminal 760 and the one end (first end) of the power inductor L71. Specifically, the switch S71 has a first terminal connected to the input terminal 760, and a second terminal connected to the one end of the power inductor L71 via the inductor connection terminal 765. In this connection configuration, ON/OFF switching of the switch S71 enables switching between connection and disconnection between the input terminal 760 and the one end of the power inductor L71.

The switch S72 is connected between the one end (first end) of the power inductor L71 and the ground. Specifically, the switch S72 has a first terminal connected to the one end of the power inductor L71 via the inductor connection terminal 765, and a second terminal connected to the ground. In this connection configuration, ON/OFF switching of the switch S72 enables switching between connection and disconnection between the one end of the power inductor L71 and the ground.

The switch S61 is connected between the other end (second end) of the power inductor L71 and the output terminal 761. Specifically, the switch S61 has a first terminal connected to the other end of power inductor L71, and a second terminal connected to the output terminal 761. In this connection configuration, ON/OFF switching of the switch S61 enables switching between connection and disconnection between the other end of the power inductor L71 and the output terminal 761.

The switch S62 is connected between the other end (second end) of the power inductor L71 and the output terminal 762. Specifically, the switch S62 has a first terminal connected to the other end of power inductor L71, and a second terminal connected to the output terminal 762. In this connection configuration, ON/OFF switching of the switch S62 enables switching between connection and disconnection between the other end of the power inductor L71 and the output terminal 762.

The switch S63 is connected between the other end (second end) of the power inductor L71 and the output terminal 763. Specifically, the switch S63 has a first terminal connected to the other end of power inductor L71, and a second terminal connected to the output terminal 763. In this connection configuration, ON/OFF switching of the switch S63 enables switching between connection and disconnection between the other end of the power inductor L71 and the output terminal 763.

The capacitor C61 is connected between the output terminal 761 and the output terminal 762. One of the two electrodes (first electrode) of the capacitor C61 is connected to the switch S61 and the output terminal 761, and the other of the two electrodes (second electrode) of the capacitor C61 is connected to the switch S62, the output terminal 762, and one of the two electrodes (first electrode) of the capacitor C62.

The capacitor C62 is connected between the output terminal 762 and the output terminal 763. The one of the two electrodes (first electrode) of the capacitor C62 is connected to the switch S62, the output terminal 762, and the other of the two electrodes (second electrode) of the capacitor C61, and the other of the two electrodes (second electrode) of the capacitor C62 is connected to the switch S63, the output terminal 763, and one of the two electrodes of the capacitor C63.

The capacitor C63 is connected between the output terminal 763 and the output terminal 764. The one of the two electrodes (first electrode) of the capacitor C63 is connected to the switch S63, the output terminal 763, and the other of the two electrodes (second electrode) of the capacitor C62, and the other of the two electrodes (second electrode) of the capacitor C63 is connected to the output terminal 764 and one of the two electrodes (first electrode) of the capacitor C64.

The capacitor C64 is connected between the output terminal 764 and the ground. The one of the two electrodes (first electrode) of the capacitor C64 is connected to the output terminal 764 and the other of the two electrodes (second electrode) of the capacitor C63, and the other of the two electrodes (second electrode) of the capacitor C64 is connected to the ground.

In operation, the plurality of switches S61 to S63 are controlled so as to be exclusively turned ON. In other words, only any one of the switches S61 to S63 is turned ON, and the others are turned OFF. Turning ON of any one of the switches S61 to S63 enables the levels of the voltages V41 to V44 to be changed.

The pre-regulator circuit 76 configured as described above supplies electric charge to the switched-capacitor circuit 77 via at least one of the plurality of output terminals 761 to 763.

The switches included in the pre-regulator circuit 76 are mounted in the tracker component (not illustrated). Specifically, the tracker component includes the plurality of switches S61 to S63, S71, and S72.

(5) Components of PA Circuit

Hereinafter, the individual components of the PA circuit 1 according to the first exemplary embodiment will be described with reference to the drawings. The PA circuit 1 according to the first embodiment is formed by a single-stage amplifier circuit.

(5.1) Transmission Circuit

Figure 2:
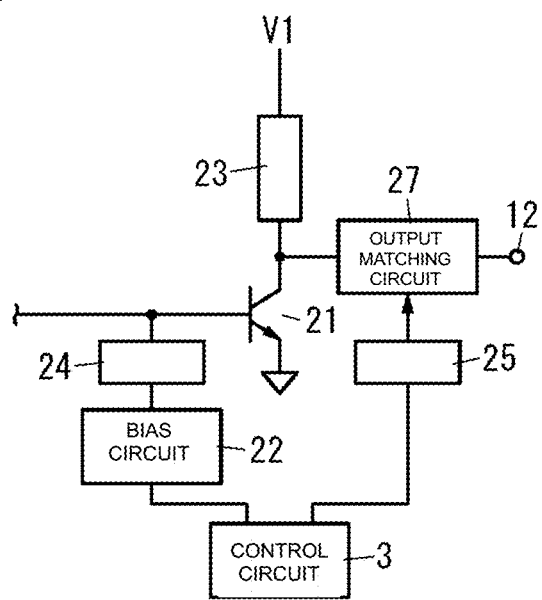
FIG. 2 is a conceptual diagram illustrating the configuration of a main part of the PA circuit.

As illustrated in FIG. 1 and FIG. 2, the transmission circuit 2 according to the first embodiment includes the transistor 21 (e.g., an amplifier element), a bias circuit 22, an inductor 23, a resistor 24, a resistor 25, an input matching circuit 26, and an output matching circuit 27. The transmission circuit 2 is formed by, for example, a single chip IC including a heterojunction bipolar transistor (HBT).

(5.2) Transistor

As illustrated in FIG. 1 and FIG. 2, the transistor 21 is, for example, an NPN transistor, and serves as an amplifier element that amplifies the power of an RF signal by being supplied with the power supply voltage V1. The transistor 21 amplifies an RF signal output from the RF signal processing circuit 75. The transistor 21 has a base connected to an output terminal of the input matching circuit 26. The base of the transistor 21 may be electrically connected to the output terminal of the input matching circuit 26 via a capacitor (not illustrated). The transistor 21 has a collector electrically connected to the inductor 23. The transistor 21 has an emitter that is grounded.

The transistor 21 and the inductor 23 form a common-emitter circuit that amplifies an RF signal input to the base. The common-emitter circuit is supplied with the power supply voltage V1. The base of the transistor 21 receives the RF signal output from the input matching circuit 26. The base of the transistor 21 is connected to the bias circuit 22 via the resistor 24, and a predetermined bias current is superimposed on the RF signal output from the input matching circuit 26. The collector of the transistor 21 is connected to the power supply circuit 73 via the inductor 23. To the collector of the transistor 21, the power supply voltage V1 controlled in accordance with the amplitude level of the RF signal is applied from the power supply circuit 73. The collector of the transistor 21 is also connected to the output terminal 12 via the output matching circuit 27.

The digital ET method is used here as described above, and thus the amplitude level of the power supply voltage V1 changes in accordance with amplitude variations of the RF signal.

(5.3) Bias Circuit

As illustrated in FIG. 2, the bias circuit 22 is a circuit for biasing the transistor 21 to an operating point. The bias circuit 22 includes, for example, a transistor such as an HBT.

The bias circuit 22 is connected to the base of the transistor 21. More specifically, the bias circuit 22 has an output terminal connected between the output terminal of the input matching circuit 26 and the base of the transistor 21. The bias circuit 22 is configured to supply a bias (e.g., a bias current) to the base of the transistor 21.

Although not illustrated, for example, the battery voltage V2 supplied from the battery of the communication device 7 or the like equipped with the RF circuit 6 is applied as a bias voltage to the collector of the transistor included in the bias circuit 22. The emitter of the transistor included in the bias circuit 22 is connected to the base of the transistor 21. It should be appreciated that the bias circuit 22 is not limited to the above-described configuration, and can have another configuration as long as it is configured for biasing the transistor 21 to an operating point.

(5.4) Input Matching Circuit

As illustrated in FIG. 1, the input matching circuit 26 is connected to the input side of the transistor 21, and serves as a matching circuit for achieving the matching between the output impedance of a circuit on the input side of the transistor 21 (for example, the RF signal processing circuit 75) and the input impedance of the transistor 21. The input matching circuit 26 includes, for example, at least one of an inductor and a capacitor.

(5.5) Output Matching Circuit

As illustrated in FIG. 1, the output matching circuit 27 is connected to the output side of the transistor 21, and serves as a matching circuit for achieving the matching between the output impedance of the transistor 21 and the input impedance of a circuit on the output side of the transistor 21 (for example, the filter 61). The output matching circuit 27 includes, for example, at least one of an inductor and a capacitor. The output matching circuit 27 is configured to change the impedance under control by the control circuit 3.

For example, the output matching circuit 27 is configured for changing the impedance by switching the connection state of the inductor or the capacitor by switching ON/OFF of a switch under control by the control circuit 3. In another example, in a case where the inductor is a variable inductor, the output matching circuit 27 is configured for changing the impedance by changing the inductance of the variable inductor under control by the control circuit 3. In another example, in a case where the capacitor is a variable capacitor, the output matching circuit 27 is configured for changing the impedance by changing the capacitance of the variable capacitor under control by the control circuit 3.

(5.6) First Terminal

As illustrated in FIG. 1, the first terminal 4 is a terminal connected to the signal processing circuit 72. A mobile industry processor interface (MIPI) signal (serial data signal) is input to the first terminal 4 from the signal processing circuit 72. The MIPI signal includes information based on the MIPI standard (serial data transmission standard). The MIPI signal input to the first terminal 4 is output to the control circuit 3.

(5.7) Second Terminal

As illustrated in FIG. 1, the second terminal 5 is connected to a path P1 extending between the signal processing circuit 72 and the power supply circuit 73. A digital signal is input to the second terminal 5. The digital signal is a signal different from the MIPI signal. The digital signal is based on the IQ signal output from the signal processing circuit 72 to the power supply circuit 73. For example, the digital signal is based on an envelope signal representing the envelope of the amplitude of an RF signal. The digital signal input to the second terminal 5 is output to the control circuit 3. The digital signal input to the second terminal 5 is based on a communication scheme different from that of the serial data signal.

In the example in FIG. 1, a power supply control signal is input as a digital signal to the second terminal 5 through the path P1 connecting the signal processing circuit 72 and the power supply circuit 73. The power supply control signal is a signal including information regarding amplitude variations of the RF signal, as described above, and is output from the signal processing circuit 72 to the power supply circuit 73 in order to change the amplitude of the power supply voltage V1 in the power supply circuit 73.

(5.8) Control Circuit

As illustrated in FIG. 1, the control circuit 3 controls the transmission circuit 2. More specifically, the control circuit 3 controls the bias circuit 22, the input matching circuit 26, and the output matching circuit 27.

The control circuit 3 controls the transmission circuit 2 in response to the digital signal input to the second terminal 5. In the first embodiment, the control circuit 3 controls the impedance of the output matching circuit 27 in response to the digital signal input to the second terminal 5. The digital signal corresponds to the power supply voltage V1 of the transistor 21, and thus the control circuit 3 is configured to obtain, from the digital signal, variations of the amplitude level of the power supply voltage V1 of the transistor 21.

The control circuit 3 controls the switch 62 in response to the digital signal input to the first terminal 4. In a case where the RF circuit 6 includes a switch (not illustrated) for selecting a filter, the control circuit 3 controls the switch for selecting a filter in response to the digital signal input to the first terminal 4. Furthermore, in a case where the RF circuit 6 includes a reception circuit (not illustrated), the control circuit 3 controls the reception circuit in response to the digital signal input to the first terminal 4.

(6) Operation of PA Circuit

Hereinafter, the operation of the PA circuit 1 according to the first embodiment will be described with reference to FIG. 3 and FIG. 4.

Figure 4:
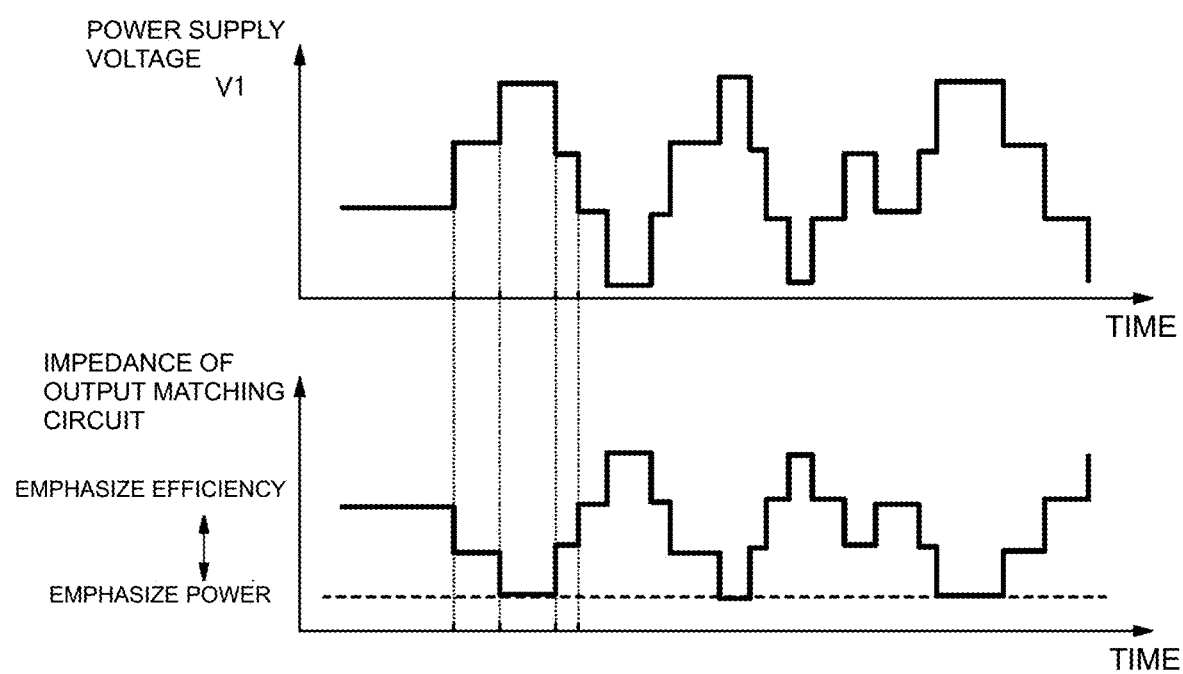
FIG. 4 includes graphs illustrating a characteristic of a power supply voltage of a transistor and an impedance characteristic of the output matching circuit in the PA circuit.

In the PA circuit 1, in which digital ET is used, the amplitude level of the power supply voltage V1 changes stepwise as illustrated in FIG. 4. Thus, compared with analog ET, it is difficult to keep the gain constant or smoothly change the gain when the magnitude of the output power of the transistor 21 (see FIG. 1) changes, and thus the gain is changed stepwise. In other words, when the magnitude of the output power of the transistor 21 changes, the variation width of the gain is larger in digital ET than in analog ET.

Figure 3:
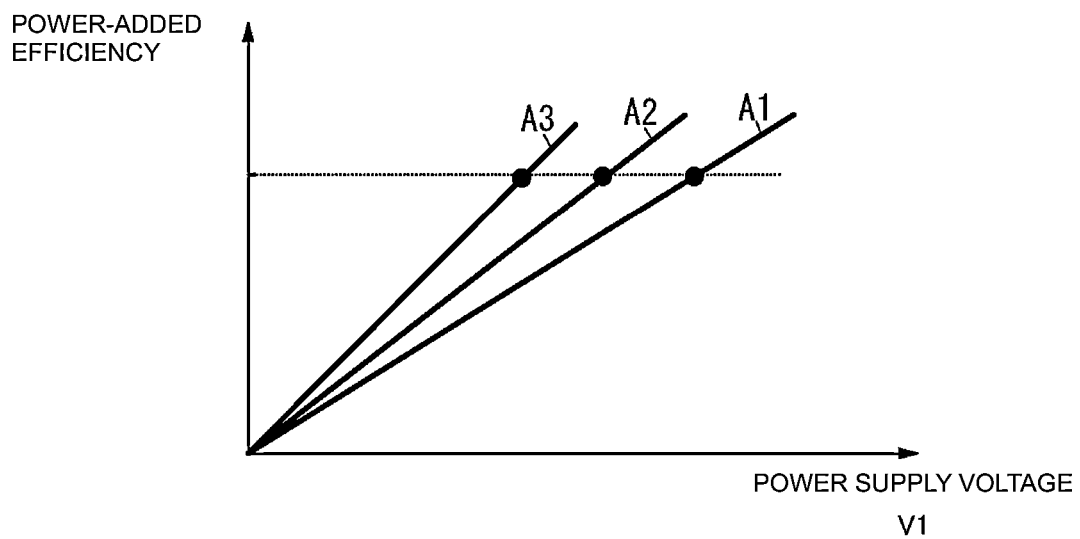
FIG. 3 is a graph illustrating the relationship between power supply voltage and power-added efficiency when the impedance of an output matching circuit is changed in the PA circuit.

As illustrated in FIG. 3, the power-added efficiency varies according to the amplitude level of the power supply voltage V1. More specifically, the power-added efficiency increases as the power supply voltage V1 increases.

In addition, the relationship between the power supply voltage V1 and the power-added efficiency varies according to the impedance of the output matching circuit 27 (see FIG. 1). The characteristic A1 in FIG. 3 is exhibited when the impedance of the output matching circuit 27 is low. The characteristic A3 in FIG. 3 is exhibited when the impedance of the output matching circuit 27 is high. The characteristic A2 in FIG. 3 is exhibited when the impedance of the output matching circuit 27 is higher than the impedance obtained when the characteristic A1 is exhibited, and lower than the impedance obtained when the characteristic A3 is exhibited. When the impedance of the output matching circuit 27 is low, the slope of the power-added efficiency with respect to the power supply voltage V1 is less steep (the characteristic A1 in FIG. 3). When the impedance of the output matching circuit 27 is high, the slope of the power-added efficiency with respect to the power supply voltage V1 is steep (the characteristic A3 in FIG. 3).

When the amplitude level of the power supply voltage V1 is the same, the power-added efficiency increases as the impedance of the output matching circuit 27 increases. When the power-added efficiency is the same, the power supply voltage V1 increases as the impedance of the output matching circuit 27 decreases.

In the PA circuit 1 according to the first embodiment, the control circuit 3 (see FIG. 1) controls the output matching circuit 27 in order to keep the power-added efficiency constant in a high state even when the amplitude level of the power supply voltage V1 changes.

First, the control circuit 3 predicts the amplitude level of the power supply voltage V1. More specifically, the control circuit 3 acquires a digital signal input to the second terminal 5 (see FIG. 1). As described above, the digital signal is a signal based on the IQ signal output from the signal processing circuit 72 (see FIG. 1) to the power supply circuit 73 (see FIG. 1). For example, the digital signal is based on an envelope signal representing the envelope of the amplitude of an RF signal. The control circuit 3 predicts the amplitude level of the power supply voltage V1 from the digital signal based on the IQ signal.

Subsequently, the control circuit 3 controls the output matching circuit 27 so that the impedance of the output matching circuit 27 changes in accordance with variations of the amplitude level of the power supply voltage V1. When the power supply voltage V1 is high, the control circuit 3 controls the output matching circuit 27 so that the impedance of the output matching circuit 27 decreases. On the other hand, when the power supply voltage V1 is low, the control circuit 3 controls the output matching circuit 27 so that the impedance of the output matching circuit 27 increases.

The PA circuit 1 performs the above-described operation, thereby decreasing the impedance of the output matching circuit 27 so as to emphasize the output power when the power supply voltage V1 is high, as illustrated in FIG. 4 ("emphasize power" in FIG. 4). On the other hand, when the power supply voltage V1 is low, the impedance of the output matching circuit 27 is increased so as to emphasize the power-added efficiency ("emphasize efficiency" in FIG. 4). In short, the impedance of the output matching circuit 27 can be changed so as to track variations of the amplitude level of the power supply voltage V1.

Accordingly, even when the amplitude level of the power supply voltage V1 changes, changing of the impedance of the output matching circuit 27 reduces the variation width of the power-added efficiency and achieves stable operation with high power-added efficiency. Thus, the variation width of the gain can also be reduced.

On the other hand, when the impedance of the output matching circuit 27 is constant regardless of variations of the amplitude level of the power supply voltage V1, the power-added efficiency decreases because the impedance of the output matching circuit 27 is set to the impedance that is obtained when the output power is maximum (low impedance).

(7) Advantageous Effects

In the PA circuit 1 according to the first embodiment, the control circuit 3 controls the transmission circuit 2 in response to a digital signal input to the second terminal 5.

Accordingly, power consumption can further be reduced while dealing with high frequencies.

The power supply voltage V1 whose amplitude level changes in accordance with amplitude variations of an RF signal is supplied to the transistor 21 (amplifier element), and the digital signal includes information regarding the amplitude variations of the RF signal. Thus, not only the power supply voltage V1 supplied to the transistor 21 but also the entire transmission circuit 2 can be brought into an optimal state in terms of efficiency in accordance with the amplitude variations of the RF signal. As a result, power consumption can further be reduced while dealing with high frequencies.

In the PA circuit 1 according to the first embodiment, the control circuit 3 controls the impedance of the output matching circuit 27 in response to a digital signal different from an MIPI signal (serial data signal). Accordingly, the gain and the power-added efficiency is improved.

In the PA circuit 1 according to the first embodiment, a power supply control signal is input as a digital signal to the second terminal 5 through the path P1 connecting the signal processing circuit 72 and the power supply circuit 73. Accordingly, the digital signal including information regarding amplitude variations of the RF signal can be easily acquired.

Second Exemplary Embodiment

Figure 7:
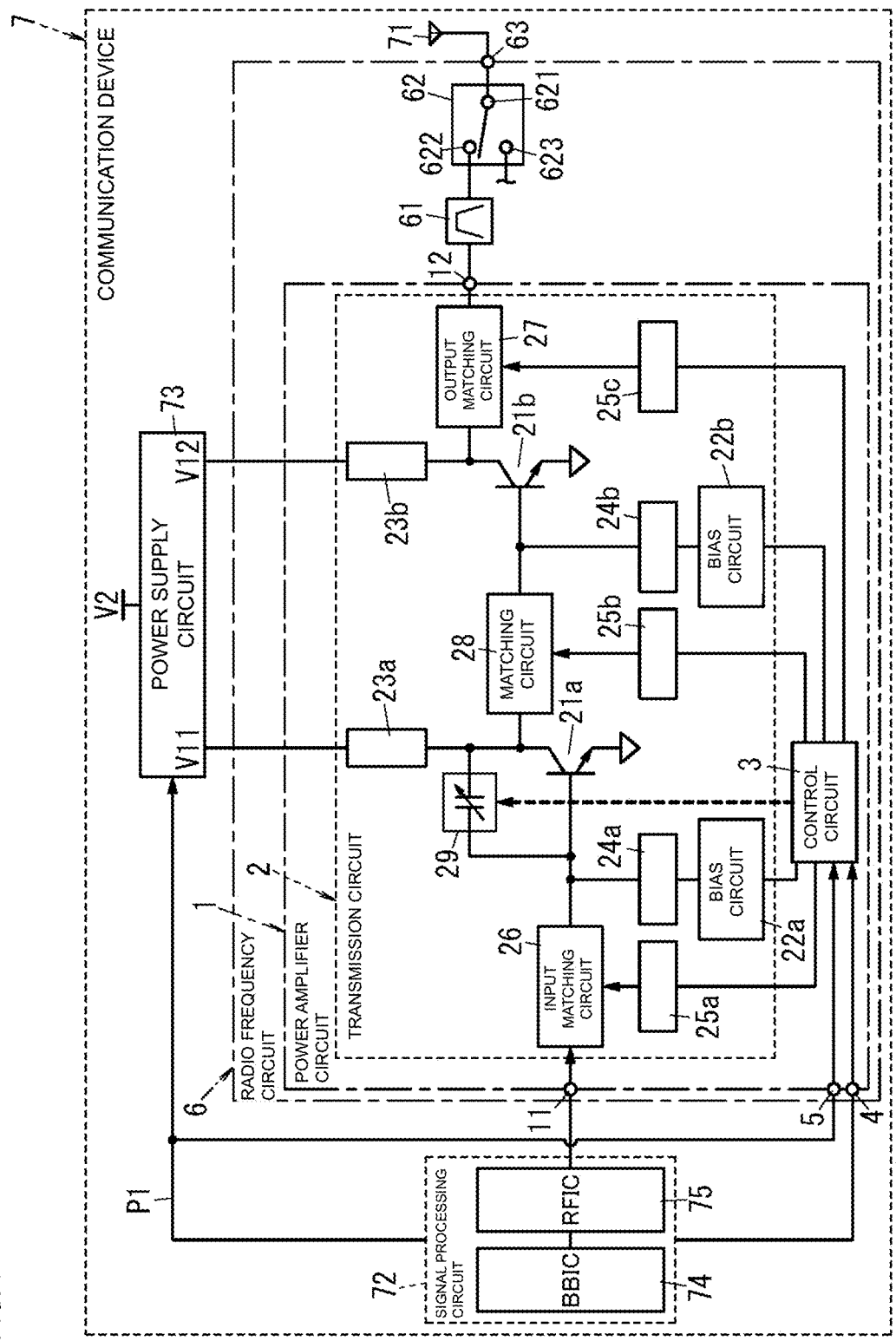
FIG. 7 is a conceptual diagram illustrating the configurations of a PA circuit, an RF circuit, and a communication device according to a second exemplary embodiment.

A PA circuit 1 according to the second exemplary embodiment is different from the PA circuit 1 according to the first embodiment (see FIG. 1) in terms of controlling a variable capacitance unit 29 in response to a digital signal input to a second terminal 5, as illustrated in FIG. 7. Regarding the PA circuit 1 according to the second embodiment, the components similar to those of the PA circuit 1 according to the first embodiment are denoted by the same reference numerals, and the description thereof will be omitted.

(1) Configuration

As illustrated in FIG. 7, the PA circuit 1 according to the second embodiment includes a transmission circuit 2, a control circuit 3, a first terminal 4, and the second terminal 5. Similarly to the RF circuit 6 according to the first embodiment (see FIG. 1), an RF circuit 6 according to the second embodiment includes the PA circuit 1, a filter 61, a switch 62, and an antenna terminal 63. Similarly to the communication device 7 according to the first embodiment (see FIG. 1) described above, a communication device 7 according to the second embodiment includes the RF circuit 6, an antenna 71, a signal processing circuit 72, and a power supply circuit 73.

(1.1) Transmission Circuit

As illustrated in FIG. 7, the transmission circuit 2 according to the second embodiment includes a plurality of (e.g., two in the illustrated example) transistors 21a and 21b (e.g., amplifier elements) and a plurality of (e.g., two in the illustrated example) bias circuits 22a and 22b. The transmission circuit 2 also includes a plurality of (two in the illustrated example) inductors 23a and 23b, a plurality of (e.g., two in the illustrated example) resistors 24a and 24b, a plurality of (e.g., three in the illustrated example) resistors 25a, 25b, and 25c, an input matching circuit 26, an output matching circuit 27, a matching circuit 28, and the variable capacitance unit 29.

(1.2) Transistor

As illustrated in FIG. 7, the transistor 21a is, for example, an NPN transistor, and serves as an amplifier element that amplifies an RF signal output from an RF signal processing circuit 75. The transistor 21a has a base connected to an output terminal of the input matching circuit 26. The base of the transistor 21a may be electrically connected to the output terminal of the input matching circuit 26 via a capacitor (not illustrated). The transistor 21a has a collector electrically connected to the inductor 23a. The transistor 21a has an emitter that is grounded.

The transistor 21a and the inductor 23a form a common-emitter circuit that amplifies an RF signal input to the base. The common-emitter circuit is supplied with a power supply voltage V11. The base of the transistor 21a receives the RF signal output from the input matching circuit 26. The base of the transistor 21a is connected to the bias circuit 22a via the resistor 24a, and a predetermined bias current is superimposed on the RF signal output from the input matching circuit 26. The collector of the transistor 21a is connected to the power supply circuit 73 via the inductor 23a. To the collector of the transistor 21a, the power supply voltage V11 controlled in accordance with the amplitude level of the RF signal is applied from the power supply circuit 73. The collector of the transistor 21a is connected to the transistor 21b via the matching circuit 28.

As illustrated in FIG. 7, the transistor 21b is, for example, an NPN transistor, and serves as an amplifier element that further amplifies the RF signal amplified by the transistor 21a. The transistor 21b has a base connected to an output terminal of the matching circuit 28. The base of the transistor 21b may be electrically connected to the output terminal of the matching circuit 28 via a capacitor (not illustrated). The transistor 21b has a collector electrically connected to the inductor 23b. The transistor 21b has an emitter that is grounded.

The transistor 21b and the inductor 23b form a common-emitter circuit that amplifies an RF signal input to the base. The common-emitter circuit is supplied with a power supply voltage V12. The base of the transistor 21b receives the RF signal output from the matching circuit 28. The base of the transistor 21b is connected to the bias circuit 22b via the resistor 24b, and a predetermined bias current is superimposed on the RF signal output from the matching circuit 28. The collector of the transistor 21b is connected to the power supply circuit 73 via the inductor 23b. To the collector of the transistor 21b, the power supply voltage V12 controlled in accordance with the amplitude level of the RF signal is applied from the power supply circuit 73. The collector of the transistor 21b is also connected to an output terminal 12 via the output matching circuit 27.

(1.3) Bias Circuit

The bias circuit 22a illustrated in FIG. 7 is a circuit for biasing the transistor 21a to an operating point. In the exemplary aspect, the bias circuit 22a includes, for example, a transistor such as an HBT.

The bias circuit 22a is connected to the base of the transistor 21a. More specifically, the bias circuit 22a has an output terminal connected between the output terminal of the input matching circuit 26 and the base of the transistor 21a. The bias circuit 22a is configured to supply a bias (bias current) to the base of the transistor 21a.

Although not illustrated, for example, a battery voltage V2 supplied from the battery of the communication device 7 or the like equipped with the RF circuit 6 is applied as a bias voltage to the collector of the transistor included in the bias circuit 22a. The emitter of the transistor included in the bias circuit 22a (i.e., the output terminal of the bias circuit 22a) is connected to the base of the transistor 21a. Again, it is noted that the bias circuit 22a is not limited to the above-described configuration, and can have another configuration as long as it is configured for biasing the transistor 21a to an operating point.

The bias circuit 22b illustrated in FIG. 7 is a circuit for biasing the transistor 21b to an operating point. The bias circuit 22b includes, for example, a transistor such as an HBT.

The bias circuit 22b is connected to the base of the transistor 21b. More specifically, the bias circuit 22b has an output terminal connected between the output terminal of the matching circuit 28 and the base of transistor 21b. The bias circuit 22b is configured to supply a bias (bias current) to the base of the transistor 21b.

Although not illustrated, for example, the battery voltage V2 supplied from the battery of the communication device 7 or the like equipped with the RF circuit 6 is applied as a bias voltage to the collector of the transistor included in the bias circuit 22b. The emitter of the transistor included in the bias circuit 22b (i.e., the output terminal of the bias circuit 22b) is connected to the base of the transistor 21b. It is again noted that the bias circuit 22b is not limited to the above-described configuration, and can have another configuration as long as it is configured for biasing the transistor 21b to an operating point.

(1.4) Matching Circuit

As illustrated in FIG. 7, the matching circuit 28 is disposed between the transistor 21a and the transistor 21b, and serves as a matching circuit for achieving the matching between the output impedance of the transistor 21a and the input impedance of the transistor 21b. The matching circuit 28 includes, for example, at least one of an inductor and a capacitor.

(1.5) Variable Capacitance Unit

Figure 8:
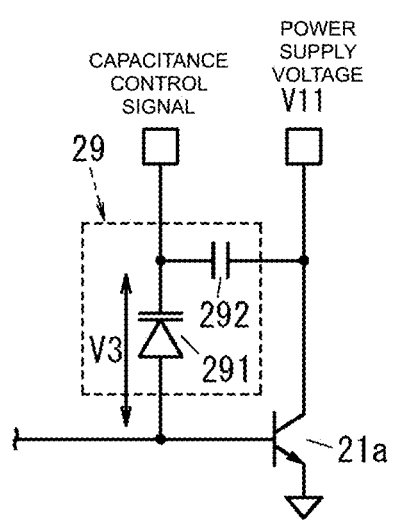
FIG. 8 is a conceptual diagram illustrating the configuration of a main part of the PA circuit.

As illustrated in FIG. 7, the variable capacitance unit 29 is disposed between the base (e.g., input terminal) and the collector (e.g., output terminal) of the transistor 21a. More specifically, as illustrated in FIG. 8, the variable capacitance unit 29 includes a variable capacitance diode 291 and a capacitor 292. The variable capacitance unit 29 has a capacitance value that decreases as the power supply voltage V11 increases. The variable capacitance unit 29 is connected between the base and collector of the transistor 21a, which is a first-stage transistor to which an RF signal is first input of the transistors 21a and 21b arranged in two stages.

The variable capacitance diode 291 has an anode connected to the base of the transistor 21a, and a cathode connected to the capacitor 292. More specifically, the variable capacitance diode 291 is connected to a path extending between the output terminal of the input matching circuit 26 and the base of the transistor 21a. The variable capacitance diode 291 has a reverse voltage V3, which is a voltage across the variable capacitance diode 291 and which is changed by a capacitance control signal described below.

The capacitor 292 is disposed between the variable capacitance diode 291 and the collector of the transistor 21a. More specifically, the capacitor 292 has a first end connected to the cathode of the variable capacitance diode 291, and a second end connected to a path extending between the collector of the transistor 21a and the power supply circuit 73.

Figure 9:
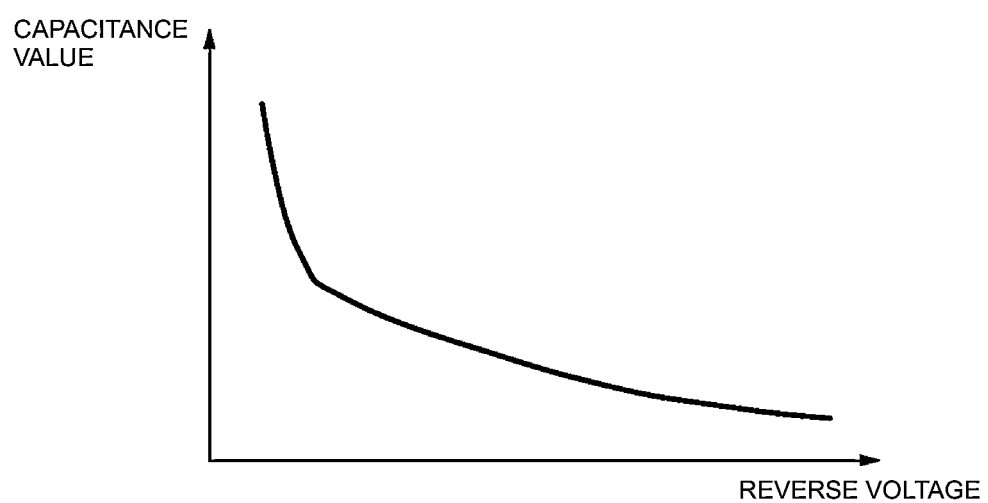
FIG. 9 is a graph illustrating the relationship between the reverse voltage of a variable capacitance diode and the capacitance value of a variable capacitance unit in the PA circuit.

As illustrated in FIG. 9, the capacitance value of the variable capacitance unit 29 (the capacitance value between the base and collector of the transistor 21a) decreases as the reverse voltage V3, which is the voltage across the variable capacitance diode 291, increases. In the exemplary aspect, the variable capacitance unit 29 is configured to change the capacitance value of the variable capacitance unit 29 by adjusting the reverse voltage V3 of the variable capacitance diode 291.

(1.6) Control Circuit

The control circuit 3 according to the second embodiment is configured to control the variable capacitance unit 29, as illustrated in FIG. 7. More specifically, the control circuit 3 controls, in response to a digital signal input to the second terminal 5, the variable capacitance unit 29 so that the capacitance value of the variable capacitance unit 29 changes. Moreover, the control circuit 3 outputs a capacitance control signal for changing the capacitance value of the variable capacitance unit 29, thereby controlling the variable capacitance unit 29.

(2) Operation of PA Circuit

Hereinafter, the operation of the PA circuit 1 according to the second embodiment will be described with reference to FIG. 7.

In the PA circuit 1, in which digital ET is used, the amplitude level of the power supply voltage V11 changes stepwise. Thus, compared with analog ET, it is difficult to keep the gain constant or smoothly change the gain when the magnitude of the output power of the transistor 21a changes, and thus the gain is changed stepwise. In other words, when the magnitude of the output power of the transistor 21a changes, the variation width of the gain is larger in digital ET than in analog ET.

Thus, the PA circuit 1 according to the second embodiment is configured to control the capacitance value of the variable capacitance unit 29 so that the variation width of the gain decreases even when the amplitude level of the power supply voltage V11 changes.

First, the control circuit 3 predicts the amplitude level of the power supply voltage V11. More specifically, the control circuit 3 acquires a digital signal input to the second terminal 5. The digital signal is an IQ signal output from the signal processing circuit 72 to the power supply circuit 73. The control circuit 3 predicts the amplitude level of the power supply voltage V11 from the digital signal, which is an IQ signal.

Subsequently, the control circuit 3 controls the variable capacitance unit 29 so that the capacitance value of the variable capacitance unit 29 changes in accordance with variations of the amplitude level of the power supply voltage V11. As described above, the capacitance value of the variable capacitance unit 29 varies according to the voltage value of the reverse voltage V3 of the variable capacitance diode 291 of the variable capacitance unit 29.

Figure 10:
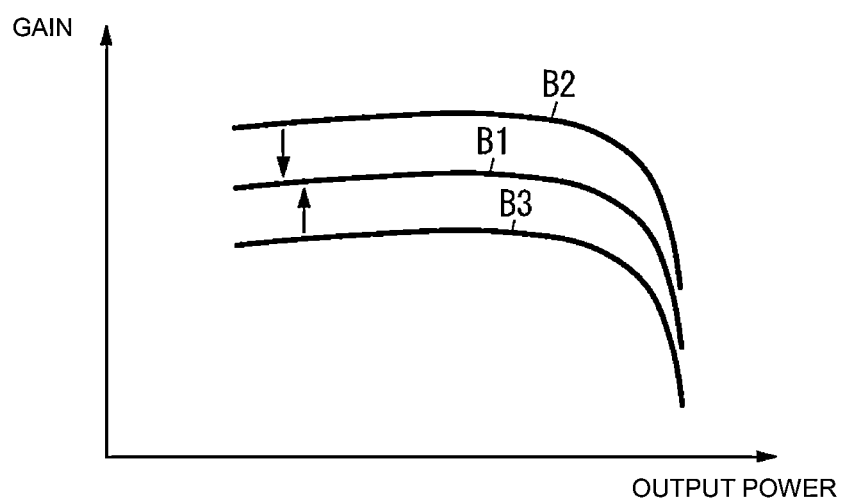
FIG. 10 is a graph illustrating the relationship between output power and gain in the PA circuit.

As illustrated in FIG. 10, when the power supply voltage V11 increases and the gain increases (i.e., the characteristic B2 in FIG. 10), it is necessary to decrease the gain. In this case, the control circuit 3 controls the variable capacitance unit 29 so that the capacitance value of the variable capacitance unit 29 increases. The control circuit 3 lowers the reverse voltage V3 of the variable capacitance diode 291, thereby increasing the capacitance value of the variable capacitance unit 29. This operation decreases the gain when the power supply voltage V11 is high (the characteristic B1 in FIG. 10).

On the other hand, when the power supply voltage V11 decreases and the gain decreases (i.e., the characteristic B3 in FIG. 10), it is necessary to increase the gain. In this case, the control circuit 3 controls the variable capacitance unit 29 so that the capacitance value of the variable capacitance unit 29 decreases. The control circuit 3 raises the reverse voltage V3 of the variable capacitance diode 291, thereby decreasing the capacitance value of the variable capacitance unit 29. This operation increases the gain when the power supply voltage V11 is low (i.e., the characteristic B1 in FIG. 10).

As described above, the capacitance value of the variable capacitance unit 29 decreases as the reverse voltage V3 of the variable capacitance diode 291 increases.

The capacitance value of the variable capacitance unit 29 decreases as the power supply voltage V11 increases, and thus the capacitance value between the base and collector of the transistor 21a is large when the power supply voltage V11 is low, and is small when the power supply voltage V11 is high.

In addition, as the capacitance value of the variable capacitance unit 29 decreases, the negative feedback applied to the transistor 21a decreases, and thus the gain of the transistor 21a increases. This makes it possible to reduce the gain deviation between the power supply voltage V11 that is low and the power supply voltage V11 that is high.

As a result of reducing the gain deviation, the variation width of the gain when the output power changes can be made smaller than in the case where the gain deviation is large.

(3) Advantageous Effects

In the PA circuit 1 according to the second embodiment, the control circuit 3 controls the variable capacitance unit 29 in response to a digital signal different from an MIPI signal (serial data signal). Accordingly, the gain and the power-added efficiency can be improved.

In the second embodiment, each of the plurality of resistors 25a, 25b, and 25c is not an essential component. The transmission circuit 2 does not necessarily need to include the plurality of resistors 25a, 25b, and 25c.

Third Exemplary Embodiment

Figure 11:
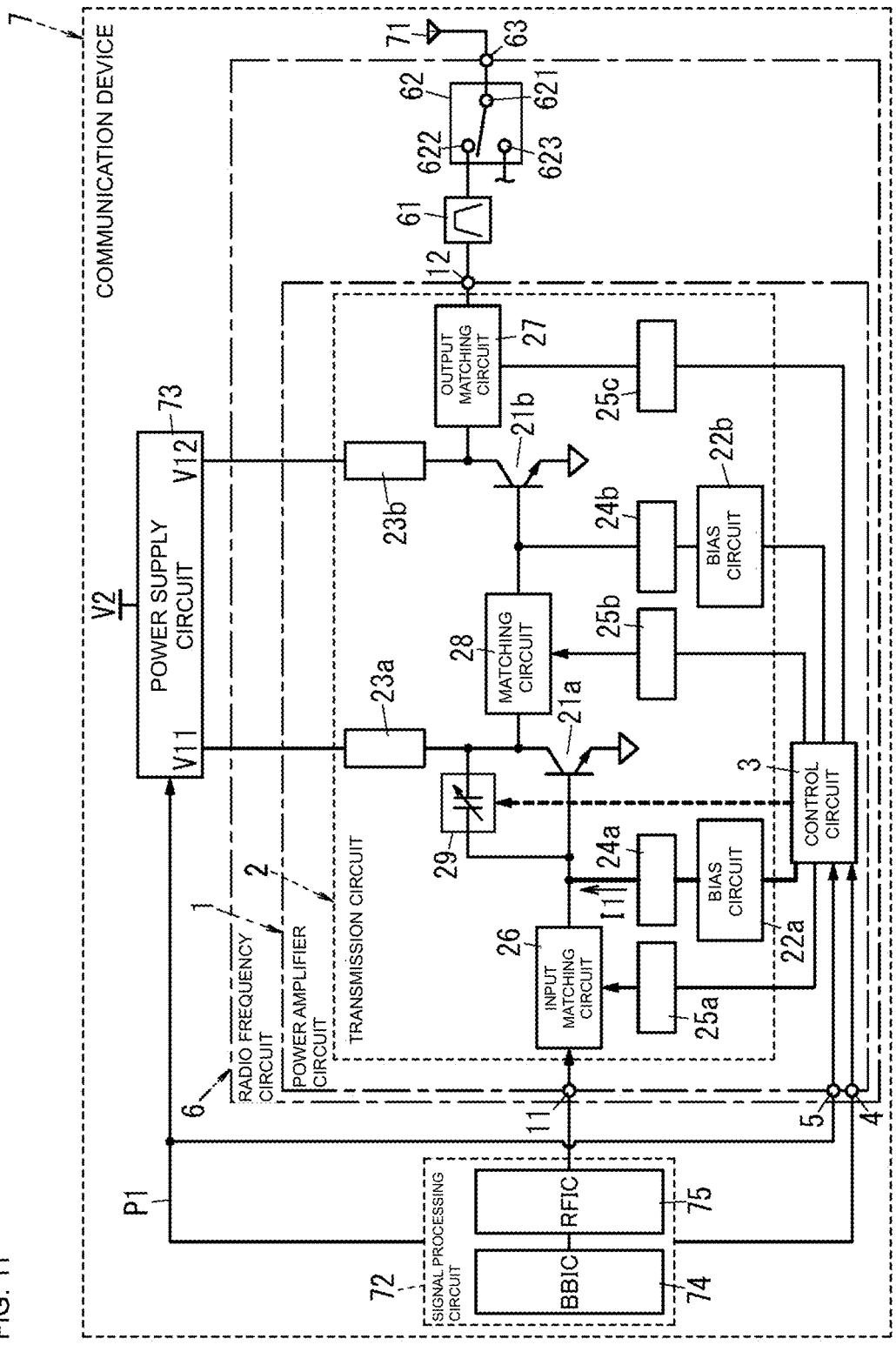
FIG. 11 is a conceptual diagram illustrating the configurations of a PA circuit, an RF circuit, and a communication device according to a third exemplary embodiment.

A PA circuit 1 according to the third exemplary embodiment is different from the PA circuit 1 according to the second embodiment (see FIG. 7) in terms of controlling a variable capacitance unit 29 and a bias circuit 22a in response to a digital signal input to a second terminal 5, as illustrated in FIG. 11. Regarding the PA circuit 1 according to the third embodiment, the components similar to those of the PA circuit 1 according to the second embodiment, as described above, are denoted by the same reference numerals, and the description thereof will be omitted.

(1) Configuration

As illustrated in FIG. 11, the PA circuit 1 according to the third embodiment includes a transmission circuit 2, a control circuit 3, a first terminal 4, and the second terminal 5. Similarly to the RF circuit 6 according to the second embodiment (see FIG. 7), an RF circuit 6 according to the third embodiment includes the PA circuit 1, a filter 61, a switch 62, and an antenna terminal 63. Similarly to the communication device 7 according to the second embodiment (see FIG. 7), a communication device 7 according to the third embodiment includes the RF circuit 6, an antenna 71, a signal processing circuit 72, and a power supply circuit 73.

(1.1) Transmission Circuit

As illustrated in FIG. 11, similarly to the transmission circuit 2 according to the second embodiment, the transmission circuit 2 according to the third embodiment includes a plurality of (e.g., two in the illustrated example) transistors 21a and 21b (e.g., amplifier elements) and a plurality of (e.g., two in the illustrated example) bias circuits 22a and 22b. The transmission circuit 2 also includes a plurality of (e.g., two in the illustrated example) inductors 23a and 23b, a plurality of (e.g., two in the illustrated example) resistors 24a and 24b, a plurality of (e.g., three in the illustrated example) resistors 25a, 25b, and 25c, an input matching circuit 26, an output matching circuit 27, a matching circuit 28, and the variable capacitance unit 29.

(1.2) Control Circuit

Figure 12:
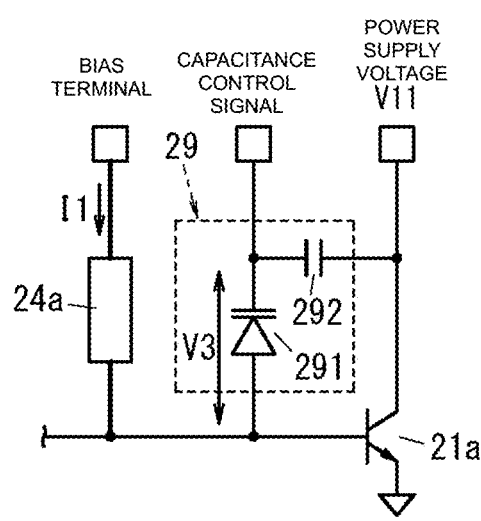
FIG. 12 is a conceptual diagram illustrating the configuration of a main part of the PA circuit.

As illustrated in FIG. 11 and FIG. 12, the control circuit 3 according to the third embodiment controls the variable capacitance unit 29 and the bias circuit 22a in response to a digital signal input to the second terminal 5. More specifically, the control circuit 3 controls a bias current I1 for the transistor 21a in response to the digital signal input to the second terminal 5.

(2) Operation of PA Circuit

Hereinafter, the operation of the PA circuit 1 according to the third embodiment will be described with reference to FIG. 11 and FIG. 13.

In the PA circuit 1, in which digital ET is used, the amplitude level of the power supply voltage V11 changes stepwise. Thus, compared with analog ET, it is difficult to keep the gain constant or smoothly change the gain when the magnitude of the output power of the transistor 21a changes, and thus the gain is changed stepwise. In other words, when the magnitude of the output power of the transistor 21a changes, the variation width of the gain is larger in digital ET than in analog ET.

Thus, the PA circuit 1 according to the third embodiment controls the bias current I1 so that the variation width of the gain decreases even when the amplitude level of the power supply voltage V11 changes. The control circuit 3 controls the bias circuit 22a so as to change the bias current I1 in conjunction with a capacitance control signal for changing the capacitance value of the variable capacitance unit 29.

Figure 13:
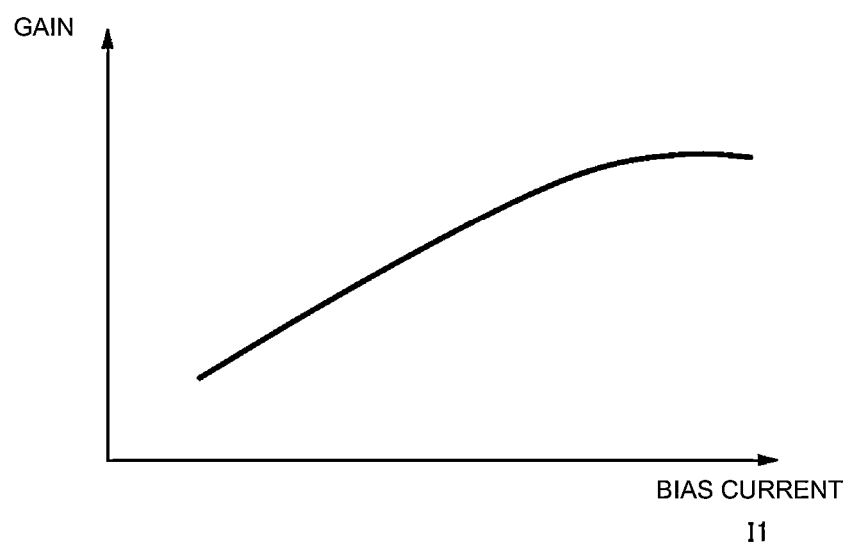
FIG. 13 is a graph illustrating the relationship between bias current and gain in the PA circuit.

As illustrated in FIG. 13, the relationship between the bias current I1 and the gain has a characteristic that the gain increases as the bias current I1 increases. The gain increases as the bias current I1 increases, and the gain decreases as the bias current I1 decreases.

When the power supply voltage V11 increases and the gain increases, it is necessary to decrease the gain. In this case, the control circuit 3 controls the bias circuit 22a so that the bias current I1 decreases. This operation decreases the gain when the power supply voltage V11 is high.

On the other hand, when the power supply voltage V11 decreases and the gain decreases, it is necessary to increase the gain. In this case, the control circuit 3 controls the bias circuit 22a so that the bias current I1 increases. This operation increases the gain when the power supply voltage V11 is low.

(3) Advantageous Effects

In the PA circuit 1 according to the third embodiment, the control circuit 3 controls the bias current I1 for the transistor 21a (amplifier element) in response to a digital signal different from an MIPI signal (serial data signal). Accordingly, the gain and the power-added efficiency can be improved.

In the third embodiment, each of the plurality of resistors 25a, 25b, and 25c is not an essential component. The transmission circuit 2 does not necessarily need to include the plurality of resistors 25a, 25b, and 25c.

Fourth Exemplary Embodiment

Figure 14:
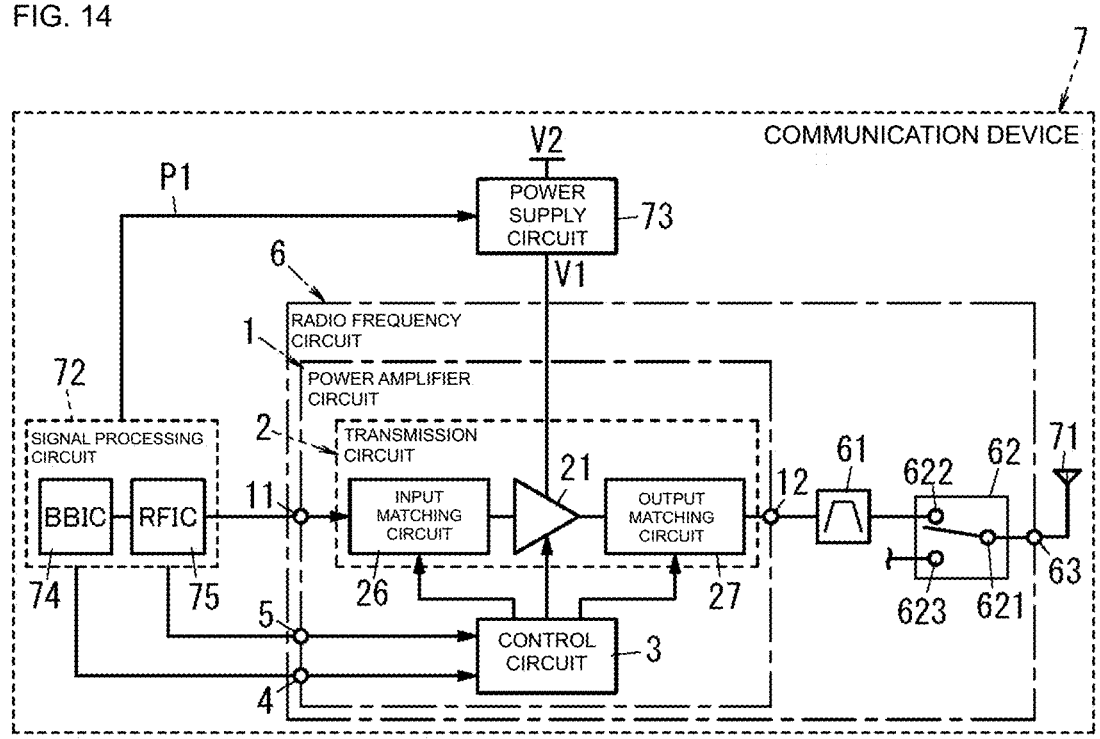
FIG. 14 is a conceptual diagram illustrating the configurations of a PA circuit, an RF circuit, and a communication device according to a fourth exemplary embodiment.

A PA circuit 1 according to the fourth exemplary embodiment is different from the PA circuit 1 according to the first embodiment (see FIG. 1) in that a power supply control signal is input as a digital signal to a second terminal 5 directly from a signal processing circuit 72, as illustrated in FIG. 14. Regarding the PA circuit 1 according to the fourth embodiment, the components similar to those of the PA circuit 1 according to the first embodiment, as described above, are denoted by the same reference numerals, and the description thereof will be omitted.

(1) Configuration

As illustrated in FIG. 14, the PA circuit 1 according to the fourth embodiment includes a transmission circuit 2, a control circuit 3, a first terminal 4, and the second terminal 5. Similarly to the RF circuit 6 according to the first embodiment (see FIG. 1), an RF circuit 6 according to the fourth embodiment includes the PA circuit 1, a filter 61, a switch 62, and an antenna terminal 63. Similarly to the communication device 7 according to the first embodiment (see FIG. 1), a communication device 7 according to the fourth embodiment includes the RF circuit 6, an antenna 71, the signal processing circuit 72, and a power supply circuit 73.

(1.1) Second Terminal

As illustrated in FIG. 14, the second terminal 5 according to the fourth embodiment is connected to the signal processing circuit 72. Similarly to the second terminal 5 according to the first embodiment (see FIG. 1), a digital signal is input to the second terminal 5. The digital signal input to the second terminal 5 is based on a communication scheme different from that of a serial data signal.

(1.2) Control Circuit

As illustrated in FIG. 14, the control circuit 3 according to the fourth embodiment controls the transmission circuit 2. For example, the control circuit 3 according to the fourth embodiment controls a variable capacitance unit 29, similarly to the control circuit 3 according to the first embodiment (see FIG. 1).

(2) Advantageous Effects

Also in the PA circuit 1 according to the fourth embodiment, similarly to the PA circuit 1 according to the first embodiment, the control circuit 3 controls the transmission circuit 2 in response to a digital signal input to the second terminal 5. Accordingly, it is possible to further reduce power consumption while dealing with high frequencies.

Fifth Exemplary Embodiment

Figure 15:
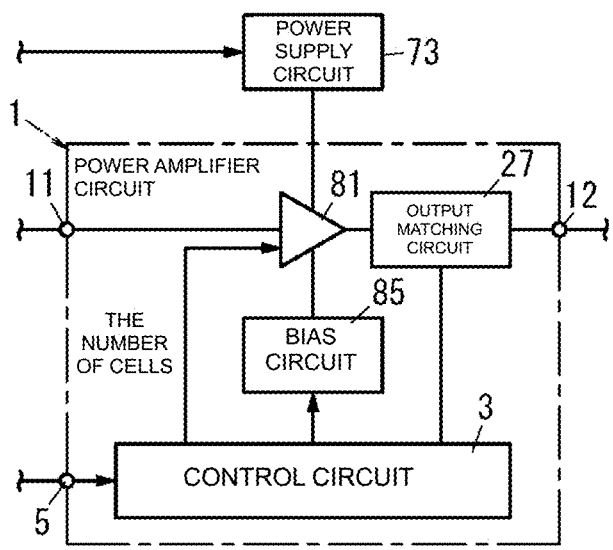
FIG. 15 is a schematic diagram illustrating the configuration of a PA circuit according to a fifth exemplary embodiment.

A PA circuit 1 according to the fifth exemplary embodiment is different from the PA circuit 1 according to the first embodiment (see FIG. 1) in terms of controlling the number of cells of a transistor 21 in response to a digital signal input to a second terminal 5, as illustrated in FIG. 15. Regarding the PA circuit 1 according to the fifth embodiment, the components similar to those of the PA circuit 1 according to the first embodiment, as described above, are denoted by the same reference numerals, and the description thereof will be omitted.

(1) Configuration

As illustrated in FIG. 15, the PA circuit 1 according to the fifth embodiment includes a transmission circuit 2, a control circuit 3, a first terminal 4, and the second terminal 5. Although not illustrated, an RF circuit according to the fifth embodiment includes the PA circuit 1, the filter 61 (see FIG. 1), the switch 62 (see FIG. 1), and the antenna terminal 63 (see FIG. 1), similarly to the RF circuit 6 according to the first embodiment (see FIG. 1). Although not illustrated, a communication device according to the fifth embodiment includes the RF circuit, the antenna 71 (see FIG. 1), the signal processing circuit 72 (see FIG. 1), and a power supply circuit 73, similarly to the communication device 7 according to the first embodiment (see FIG. 1).

The transmission circuit 2 includes an amplifier circuit 81 and an output matching circuit 27. The amplifier circuit 81 includes an amplifier transistor 82 and a plurality of bias circuits 85a to 85c. The amplifier transistor 82 includes a plurality of cell transistors 83a to 83c having sizes different from each other.

Hereinafter, a description will be given of the configuration of a main part for switching the effective size of the amplifier transistor 82 in the amplifier circuit 81.

Figure 16:
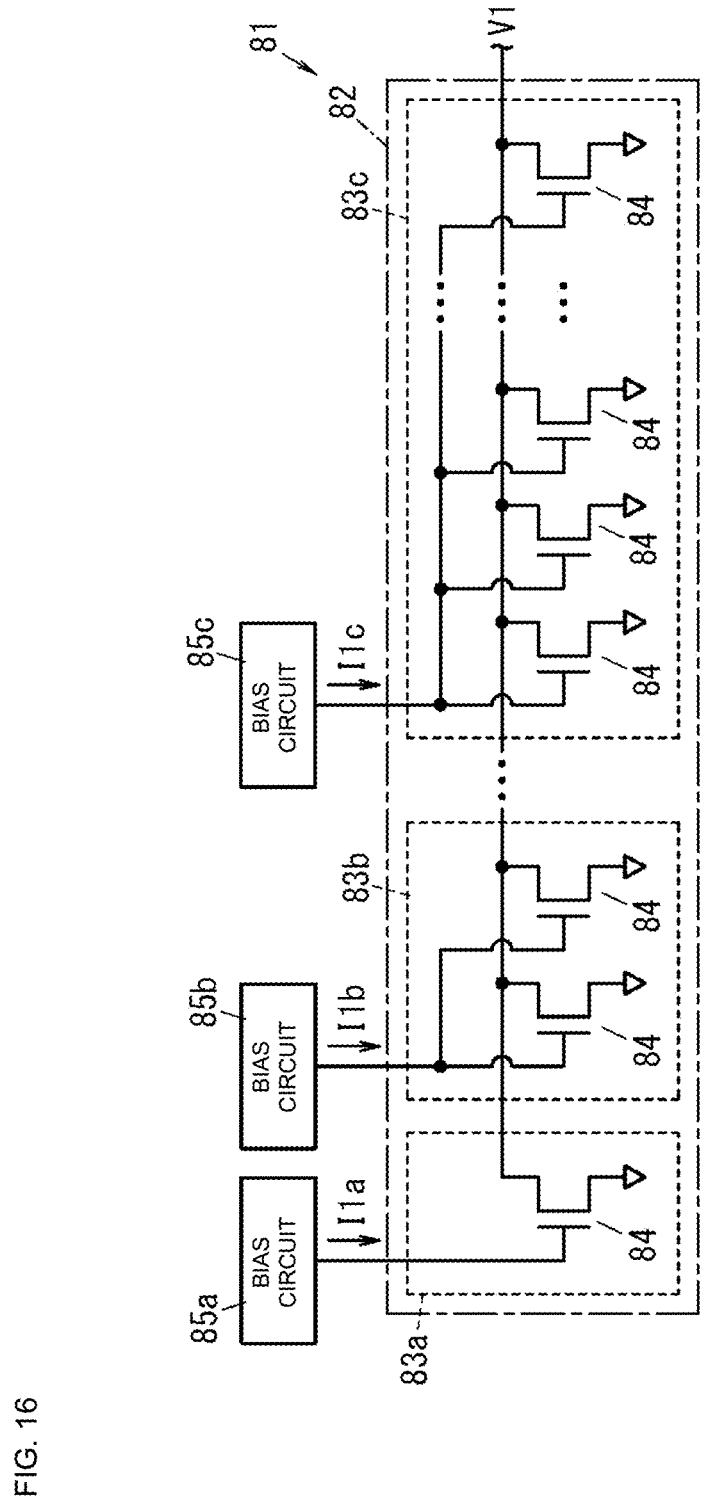
FIG. 16 is a circuit diagram illustrating the configuration of a transistor of the PA circuit.

As illustrated in FIG. 16, the amplifier transistor 82 includes the plurality of cell transistors 83a to 83c having sizes different from each other.

Moreover, the individual cell transistors 83a to 83c include subtransistors 84 of different numbers. All the subtransistors 84 may have the same size. Accordingly, the effective sizes of the cell transistors 83a to 83c are determined in accordance with the numbers of subtransistors 84 included therein.

The effective sizes of the cell transistors 83a to 83c may be determined in accordance with the sizes of the subtransistors 84 included therein. In other words, the sizes of the subtransistors 84 may vary for each of the cell transistors 83a to 83c, and the effective sizes of the respective cell transistors 83a to 83c may be determined accordingly. In this case, the effective sizes of the cell transistors 83a to 83c are different from each other even if the cell transistors 83a to 83c each include the same number of subtransistors 84.

The size of each subtransistor 84 is an emitter area in the case of a bipolar transistor, and is an opposing area between the drain and the source in the case of a field-effect transistor. The sizes of the cell transistors 83a to 83c are the sums of the sizes of the subtransistors 84 included in the cell transistors 83a to 83c.

The subtransistors 84 included in the cell transistors 83a to 83c are driven in units of the cell transistors 83a to 83c in accordance with bias currents I1a to I1c supplied from the bias circuits 85a to 85c, respectively. The effective size of the amplifier transistor 82 is switched in accordance with the number and combination of the cell transistors 83a to 83c that are driven.

Figure 17:
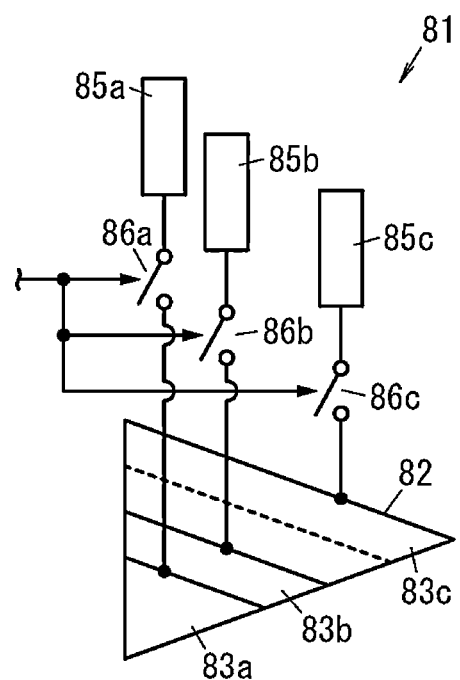
FIG. 17 is a circuit diagram illustrating the configuration of bias circuits of the PA circuit.

As illustrated in FIG. 17, the bias circuits 85a to 85c are connected to the cell transistors 83a to 83c via switches 86a to 86c, respectively. The switches 86a to 86c may be disposed inside the bias circuits 85a to 85c, respectively.

In the example in FIG. 17, switching between ON and OFF of the switches 86a to 86c is performed in response to a bias selection signal. Accordingly, the output power of the PA circuit 1 is adjusted. In addition, each of the bias circuits 85a to 85c included in the amplifier circuit 81 may individually switch between supply and stop of a bias current in response to a control signal (not illustrated), for example. Accordingly, the cell transistors 83a to 83c included in the amplifier circuit 81 are individually driven and stopped, and thus the output power of the PA circuit 1 is finely adjusted.

Driving of all the cell transistors 83a to 83c of the amplifier circuit 81 in response to a bias selection signal makes it possible to obtain maximum output power in the PA circuit 1. Driving of only a necessary number of the cell transistors 83a to 83c in the amplifier circuit 81 makes it possible to obtain lower output power.

(2) Advantageous Effects

In the PA circuit 1 according to the fifth embodiment, only cell transistors of a desired size and number among the cell transistors 83a to 83c included in the amplifier transistor 82 of the desired amplifier circuit 81 can be driven in accordance with the bias currents supplied from the bias circuits 85a to 85c disposed in the amplifier circuit 81. In other words, all the cell transistors 83a to 83c of the amplifier circuit 81 can be driven to obtain high output power, and only a necessary number of the cell transistors 83a to 83c of the amplifier circuit 81 can be driven to obtain lower output power. As a result, the effective total size of the amplifier transistor 82 can be finely adjusted to optimize current consumption, and the PA circuit 1 having excellent efficiency and gain in a wide range of output power can be obtained.

Sixth Exemplary Embodiment

In the sixth exemplary embodiment, the RF module 9 illustrated in FIG. 18 and FIG. 19 will be described.

(1) Configuration

Figure 18:
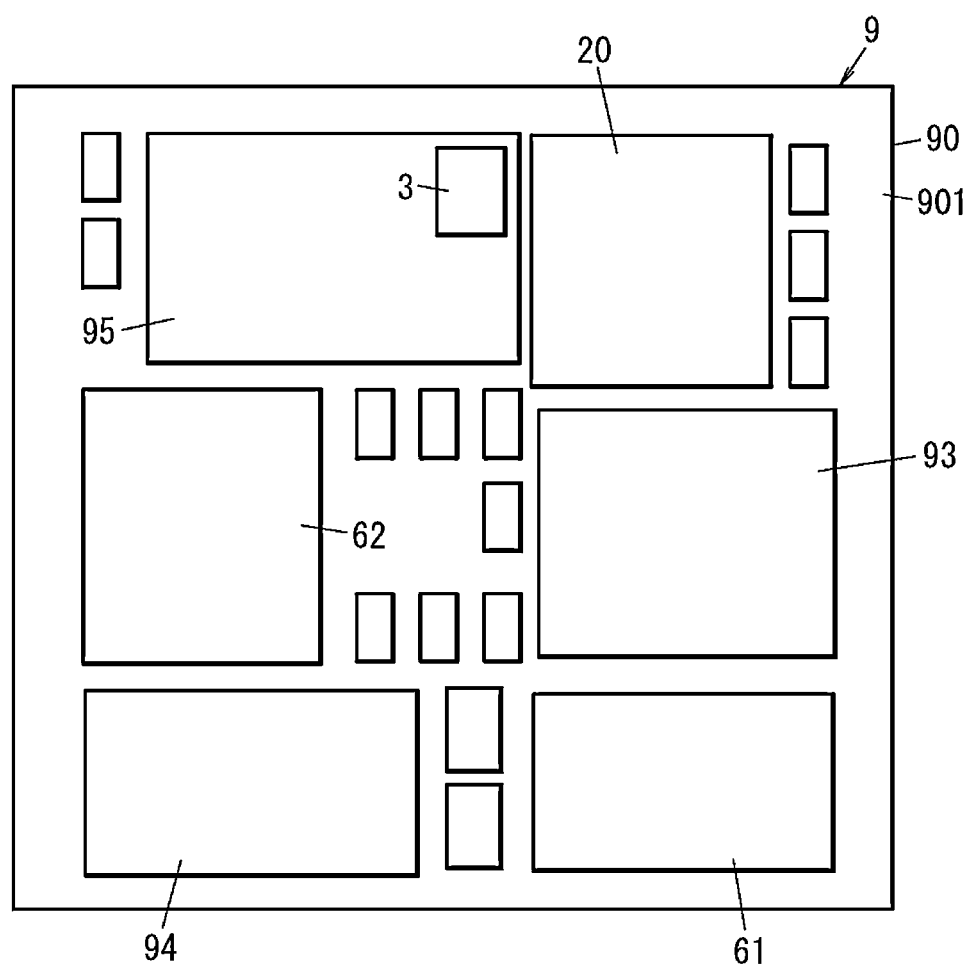
FIG. 18 is a plan view of an RF module according to a sixth exemplary embodiment.
Figure 19:
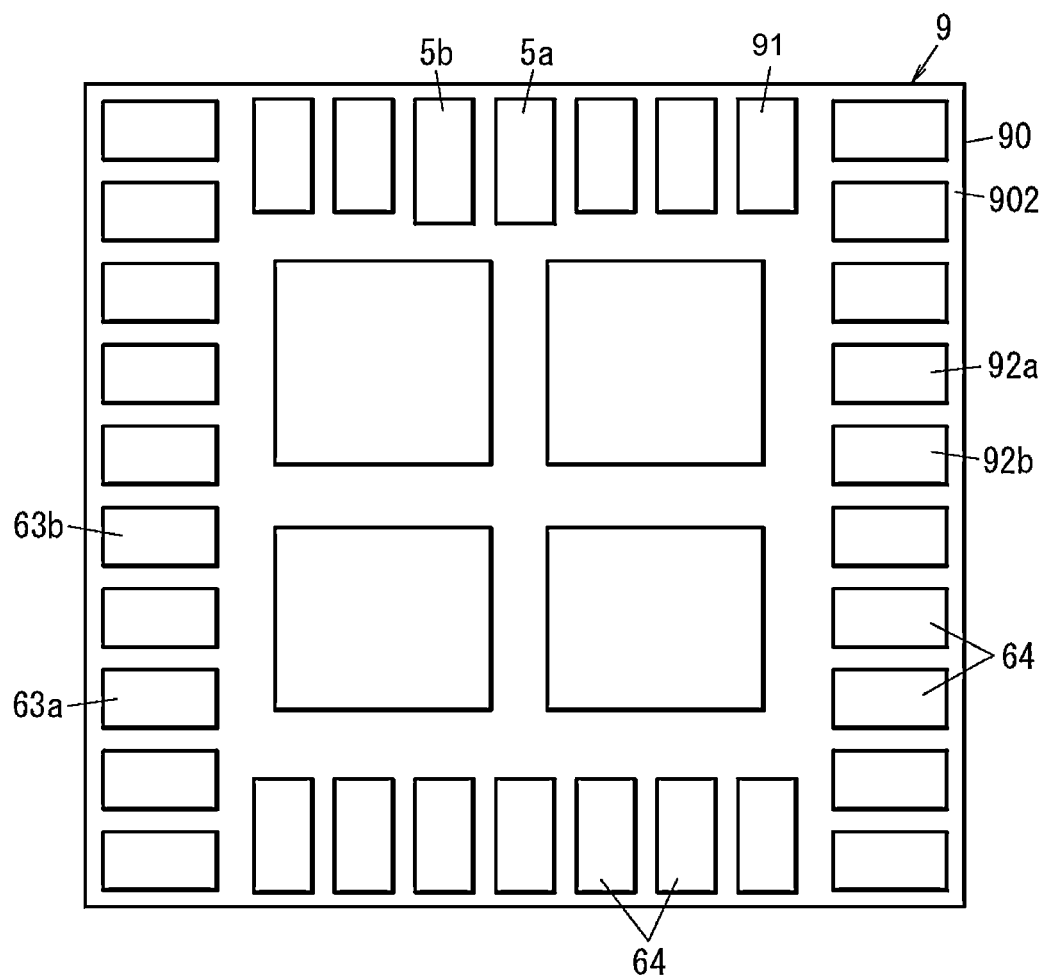
FIG. 19 is a perspective view of the RF module.

As illustrated in FIG. 18 and FIG. 19, the RF module 9 according to the sixth embodiment includes a mounting substrate 90, a signal input terminal 91, a plurality of (two in the illustrated example) power supply voltage terminals 92a and 92b, a matching component 93, a low-noise amplifier 94, a PA 20, a control component 95, a plurality of (two in the illustrated example) second terminals 5a and 5b, a filter 61, a switch 62, and a plurality of (two in the illustrated example) antenna terminals 63a and 63b.

(1.1) Mounting Substrate

As illustrated in FIG. 18 and FIG. 19, the mounting substrate 90 has a first main surface 901 and a second main surface 902. The first main surface 901 and the second main surface 902 face each other in the thickness direction of the mounting substrate 90. The second main surface 902 faces an external substrate (not illustrated) when the RF module 9 is disposed on the external substrate. Moreover, the mounting substrate 90 is a double-sided mounting substrate having electronic components mounted on each of the first main surface 901 and the second main surface 902.

The mounting substrate 90 is a multilayer substrate including a plurality of dielectric layers laminated one on top of another. The mounting substrate 90 includes a plurality of conductive layers and a plurality of via conductors (including through electrodes). The plurality of conductive layers include a ground layer having a ground potential. The plurality of via conductors are used for electrical connection between the elements mounted on each of the first main surface 901 and the second main surface 902 and the conductive layers of the mounting substrate 90. The plurality of via conductors are used for electrical connection between the elements mounted on the first main surface 901 and the elements mounted on the second main surface 902, and for electrical connection between the conductive layers of the mounting substrate 90 and external connection terminals 64. The plurality of external connection terminals 64 are disposed on the second main surface 902 of the mounting substrate 90.

(1.2) Power Supply Voltage Terminals

As illustrated in FIG. 19, the plurality of power supply voltage terminals 92a and 92b are disposed on or in the mounting substrate 90. More specifically, the plurality of power supply voltage terminals 92a and 92b are disposed on the second main surface 902 of the mounting substrate 90.

(1.3) Matching Component

As illustrated in FIG. 18, the matching component 93 is disposed on or in the mounting substrate 90. More specifically, the matching component 93 is disposed on the first main surface 901 of the mounting substrate 90.

(1.4) Low-Noise Amplifier

As illustrated in FIG. 18, the low-noise amplifier 94 is disposed on or in the mounting substrate 90. More specifically, the low-noise amplifier 94 is disposed on the first main surface 901 of the mounting substrate 90.

The low-noise amplifier 94 has an input terminal and an output terminal. The low-noise amplifier 94 is disposed in a reception path connected to a signal output terminal. The low-noise amplifier 94 amplifies a received signal in a predetermined frequency band input to the input terminal, and outputs the amplified signal from the output terminal. The output terminal of the low-noise amplifier 94 is connected to the signal output terminal. Thus, the output terminal of the low-noise amplifier 94 is connected to the signal processing circuit 72 via the signal output terminal.

(1.5) PA

As illustrated in FIG. 18, the PA 20 is disposed on or in the mounting substrate 90. More specifically, the PA 20 is disposed on the first main surface 901 of the mounting substrate 90.

The PA 20 is disposed in a transmission path and is configured to amplify a transmission signal received from the signal processing circuit 72, and outputs the amplified signal. More specifically, the PA 20 amplifies a transmission signal in a predetermined frequency band received from the signal processing circuit 72, and outputs the amplified signal.

The PA 20 has an input terminal and an output terminal. The input terminal of the PA 20 is connected to the signal input terminal 91. Thus, the input terminal of the PA 20 is connected to the signal processing circuit 72 via the signal input terminal 91. The output terminal of the PA 20 is connected to the filter 61 via the output matching circuit 27.

(1.6) Control Component

As illustrated in FIG. 18, the control component 95 is disposed on or in the mounting substrate 90. More specifically, the control component 95 is disposed on the first main surface 901 of the mounting substrate 90. The control component 95 includes the control circuit 3.

(1.7) Second Terminals

As illustrated in FIG. 19, the plurality of second terminals 5a and 5b are disposed on or in the mounting substrate 90. More specifically, the plurality of second terminals 5a and 5b are disposed on the second main surface 902 of the mounting substrate 90. Digital signals input to the plurality of second terminals 5a and 5b are signals for controlling the PA 20 that amplifies the power of an RF signal.

The plurality of second terminals 5a and 5b are adjacent to each other on or in the mounting substrate 90. This arrangement reduces variation of the wiring length, and thus a rapid change of a digital signal can be realized.

(1.8) Filter

As illustrated in FIG. 18, the filter 61 is disposed on or in the mounting substrate 90. More specifically, the filter 61 is disposed on the first main surface 901 of the mounting substrate 90.

(1.9) Switch

As illustrated in FIG. 18, the switch 62 is disposed on or in the mounting substrate 90. More specifically, the switch 62 is disposed on the first main surface 901 of the mounting substrate 90.

(1.10) Antenna Terminals

As illustrated in FIG. 19, the plurality of antenna terminals 63a and 63b are disposed on or in the mounting substrate 90. More specifically, the plurality of antenna terminals 63a and 63b are disposed on the second main surface 902 of the mounting substrate 90. The plurality of antenna terminals 63a and 63b are terminals through which RF signals pass.

(2) Advantageous Effects

Also in the RF module 9 according to the sixth embodiment, similarly to the first embodiment, the control circuit 3 controls the PA 20 in response to digital signals input to the second terminals 5a and 5b. Accordingly, power consumption can be further reduced while dealing with high frequencies.

In the RF module 9 according to the sixth embodiment, the plurality of second terminals 5a and 5b are adjacent to each other. This arrangement reduces variation of the wiring length, and thus a rapid change of a digital signal can be realized.

Seventh Exemplary Embodiment

Figure 20:
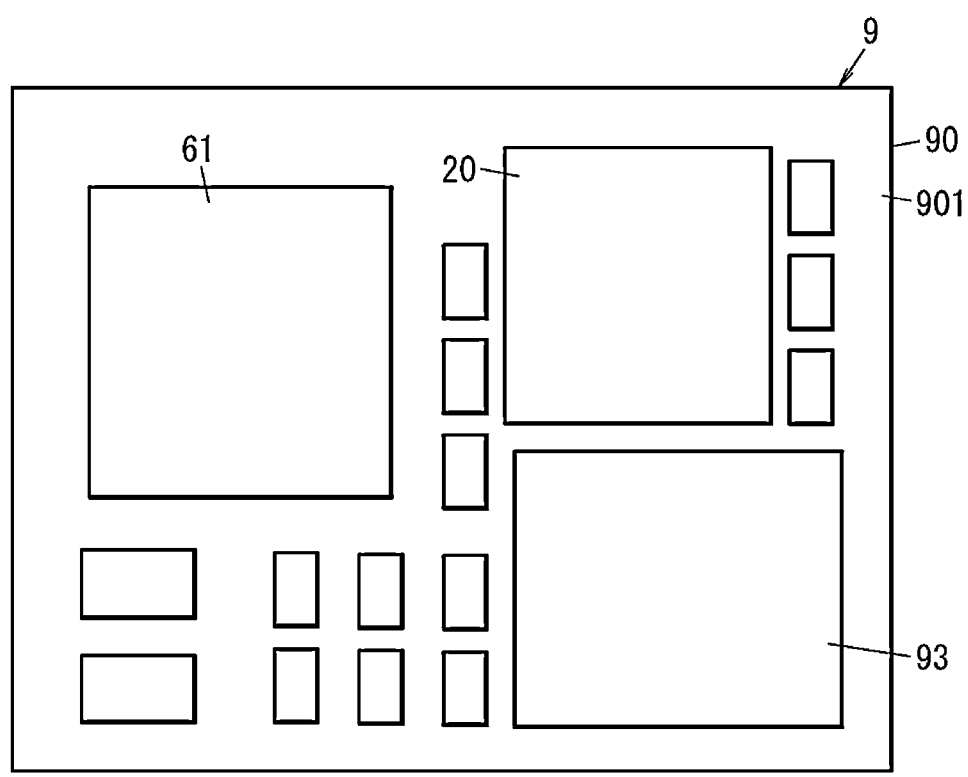
FIG. 20 is a plan view of an RF module according to a seventh exemplary embodiment.
Figure 21:
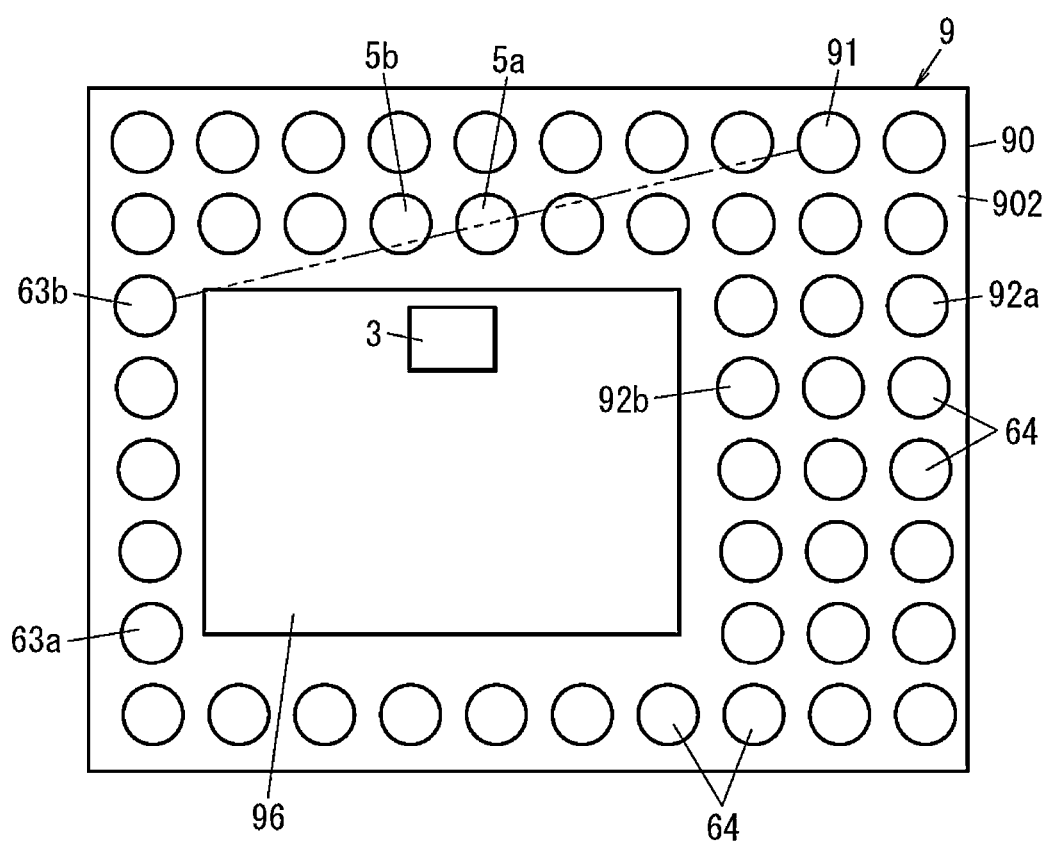
FIG. 21 is a perspective view of the RF module.

An RF module 9 according to the seventh exemplary embodiment is different from the RF module 9 according to the sixth embodiment (see FIG. 18 and FIG. 19) in that an IC chip 96 is disposed on a second main surface 902 of a mounting substrate 90, as illustrated in FIG. 20 and FIG. 21. Regarding the RF module 9 according to the seventh embodiment, the components similar to those of the RF module 9 according to the sixth embodiment, as described above, are denoted by the same reference numerals, and the description thereof will be omitted.

(1) Configuration

As illustrated in FIG. 20 and FIG. 21, the RF module 9 according to the seventh embodiment includes the mounting substrate 90, a signal input terminal 91, a plurality of (e.g., two in the illustrated example) power supply voltage terminals 92a and 92b, a matching component 93, the IC chip 96, a PA 20, a plurality of (e.g., two in the illustrated example) second terminals 5a and 5b, a filter 61, and a plurality of (e.g., two in the illustrated example) antenna terminals 63a and 63b.

(1.1) IC Chip

As illustrated in FIG. 21, the IC chip 96 is disposed on or in the mounting substrate 90. More specifically, the IC chip 96 is disposed on the second main surface 902 of the mounting substrate 90.

The IC chip 96 includes the control circuit 3. The IC chip 96 also includes a low-noise amplifier and the switch 62 (see FIG. 1). In other words, the IC chip 96 is a component including the control circuit 3, the low-noise amplifier, and the switch 62 integrated together.

(1.2) Second Terminals

The second terminals 5a and 5b are disposed adjacent to the control circuit 3 on or in the mounting substrate 90. More specifically, the second terminals 5a and 5b are disposed adjacent to the control circuit 3 on the second main surface 902 of the mounting substrate 90. This arrangement reduces the wiring length between the second terminals 5a and 5b and the control circuit 3.

The second terminals 5a and 5b are located between two signal terminals in plan view in the thickness direction of the mounting substrate 90. In the example in FIG. 21, the second terminals 5a and 5b are located between the signal input terminal 91 (signal terminal) and the antenna terminal 63b (signal terminal) in plan view in the thickness direction of the mounting substrate 90. With this arrangement, signal interference between the signal terminals can be reduced in a limited space because the second terminals 5a and 5b are digital terminals that are resistant to noise. In this specification, "the second terminals 5a and 5b are located between two signal terminals in plan view in the thickness direction of the mounting substrate 90" means that at least one of a plurality of line segments connecting a certain point in one of the two signal terminals (first signal terminal) and a certain point in the other of the two signal terminals (second signal terminal) passes through the regions of the second terminals 5a and 5b in plan view in the thickness direction of the mounting substrate 90. In addition, "plan view in the thickness direction of the mounting substrate 90" means that the electronic components and the terminals disposed on or in the mounting substrate 90 are orthogonally projected and viewed on a plane parallel to the main surfaces of the mounting substrate 90.

(2) Advantageous Effects

Also in the RF module 9 according to the seventh embodiment, similarly to the first embodiment, the control circuit 3 controls the PA 20 in response to digital signals input to the second terminals 5a and 5b. Accordingly, power consumption can be further reduced while dealing with high frequencies.

In the RF module 9 according to the seventh embodiment, the plurality of second terminals 5a and 5b are disposed adjacent to the control circuit 3. This arrangement reduces the wiring length between the plurality of second terminals 5a and 5b and the control circuit 3.

In the RF module 9 according to the seventh embodiment, the second terminals 5a and 5b are digital terminals (i.e., terminals to which digital signals are input) and are thus resistant to noise. Thus, signal interference between signal terminals (for example, between the signal input terminal 91 and the antenna terminal 63b) can be reduced in a limited space.

Modifications

The PA circuit 1 may have a configuration including only one stage of the transistor 21 serving as an amplifier element, or may have a configuration including two stages of the transistors 21a and 21b according to various exemplary aspects. Moreover, the PA circuit 1 may have a configuration including three or more stages of transistors. The PA circuit 1 that includes a plurality of stages of transistors is configured for further increasing the gain of an RF signal output from the PA circuit 1 and increasing the linearity of the RF signal.

As a modification of the PA circuits 1 according to the second and third embodiments, the variable capacitance unit 29 may be a variable capacitance unit whose capacitance value changes in an analog manner or a variable capacitance unit whose capacitance value changes in a digital manner. For example, the variable capacitance unit 29 may have a plurality of fixed capacitance values and may be configured to switch between the capacitance values by a switch.

It is also noted that the variable capacitance unit 29 is not limited to the variable capacitance diode 291, and an element other than the variable capacitance diode 291 may be used as long as the element is capable of varying the capacitance value. For example, the variable capacitance unit 29 may be a digital tunable capacitor (DTC).

The PA circuits 1 according to the second and third embodiments have, when the transistors 21a and 21b serving as amplifier elements are provided in a plurality of stages, a configuration in which the variable capacitance unit 29 is connected between the base and collector of the transistor 21a in the first stage to which an RF signal is first input. The PA circuit 1 according to a modification of the second and third embodiments is not limited to the configuration in which the variable capacitance unit 29 is connected to the transistor 21a in the first stage. The variable capacitance unit 29 may be connected between the base and collector of the other transistor 21b, or the variable capacitance unit 29 may be connected between the base and collector of both the transistors 21a and 21b in the first stage and the stage other than the first stage.

The second terminal 5 of the PA circuit 1 does not necessarily need to be connected to the path P1 connecting the signal processing circuit 72 and the power supply circuit 73, and may be connected to the power supply circuit 73. In this case, the power supply circuit 73 includes not only an input terminal (not illustrated) for receiving a power supply control signal and a voltage generator for generating the power supply voltage V1 (V11, V12), but also an output terminal (not illustrated) for outputting the power supply control signal. The second terminal 5 is connected to the output terminal of the power supply circuit 73. The power supply circuit 73 outputs, from the output terminal, the power supply control signal input to the input terminal. Accordingly, the power supply control signal is input as a digital signal to the second terminal 5. In this case, the power supply control signal can be input to the second terminal 5 without changing the path P1 connecting the signal processing circuit 72 and the power supply circuit 73.

In general, it is noted that the exemplary embodiments and modifications described above are merely some of various embodiments and modifications of the present invention. The embodiments and modifications can be variously changed according to design or the like as long as the object of the present invention can be achieved.

Aspects

The specification discloses the following exemplary aspects.

A power amplifier circuit (1) according to a first exemplary aspect includes a transmission circuit (2), a control circuit (3), a first terminal (4), and a second terminal (5). The transmission circuit (2) includes an amplifier element (transistor 21; 21a; 21b) that is configured to amplify power of a radio frequency signal. The control circuit (3) is configured to control the transmission circuit (2). The first terminal (4) is configured to receive a serial data signal. The serial data signal is a signal based on a serial data transmission standard. The second terminal (5) is configured to receive a digital signal different from the serial data signal. The control circuit (3) is configured to control the transmission circuit (2) in response to the digital signal received from the second terminal (5).

With the power amplifier circuit (1) according to the first aspect, power consumption can be reduced while dealing with high frequencies.

In a power amplifier circuit (1) according to a second exemplary aspect, in the first aspect, the transmission circuit (2) further includes an output matching circuit (27). The output matching circuit (27) is connected to an output side of the amplifier element (transistor 21; 21a; 21b). The control circuit (3) is configured to control an impedance of the output matching circuit (27) in response to the digital signal.

With the power amplifier circuit (1) according to the second aspect, gain and power-added efficiency can be improved.

In a power amplifier circuit (1) according to a third exemplary aspect, in the first aspect, the transmission circuit (2) further includes a variable capacitance unit (29). The variable capacitance unit (29) is disposed between an input terminal (base) and an output terminal (collector) of the amplifier element (transistor 21; 21*a*; 21*b*). The control circuit (3) is configured to control the variable capacitance unit (29) in response to the digital signal.

With the power amplifier circuit (1) according to the third aspect, gain and power-added efficiency can be further improved.

In a power amplifier circuit (1) according to a fourth exemplary aspect, in the first aspect, the control circuit (3) is configured to control a bias current for the amplifier element (transistor 21; 21*a*; 21*b*) in response to the digital signal.

With the power amplifier circuit (1) according to the fourth aspect, gain and power-added efficiency can be further improved.

A power amplifier circuit (1) according to a fifth exemplary aspect, in the fourth aspect, further includes a plurality of bias circuits (85*a* to 85*c*) and a switch (86*a* to 86*c*). The plurality of bias circuits (85*a* to 85*c*) are circuits configured to supply the bias current for the amplifier element (transistor 21; 21*a*; 21*b*). The switch (86*a* to 86*c*) is configured to switch between the plurality of bias circuits (85*a* to 85*c*). The control circuit (3) is configured to control the switch (86*a* to 86*c*) in response to the digital signal, to control the bias current for the amplifier element.

In a power amplifier circuit (1) according to a sixth exemplary aspect, in the first aspect, the second terminal (5) is configured to receive a power supply control signal as the digital signal through a path (P1) connecting a signal processing circuit (72) and a power supply circuit (73). The signal processing circuit (72) is configured to output the radio frequency signal to the transmission circuit (2). The power supply circuit (73) is configured to change an amplitude of a power supply voltage (V1; V11; V12) for the amplifier element (transistor 21; 21*a*; 21*b*) in response to the power supply control signal from the signal processing circuit (72). The power supply control signal includes information based on an envelope signal indicating an envelope of an amplitude of the radio frequency signal, and is output, to change the amplitude of the power supply voltage (V1; V11; V12), from the signal processing circuit (72) to the power supply circuit (73).

With the power amplifier circuit (1) according to the sixth aspect, it is possible to easily acquire a digital signal including information regarding amplitude variations of a radio frequency signal.

A radio frequency circuit (6) according to a seventh exemplary aspect includes the power amplifier circuit (1) according to the first aspect, an antenna terminal (63), and a filter (61). The filter (61) is disposed in a path extending between the power amplifier circuit (1) and the antenna terminal (63).

With the radio frequency circuit (6) according to the seventh aspect, in the power amplifier circuit (1), not only the power supply voltage (V1; V11; V12) for the amplifier element (transistor 21; 21*a*; 21*b*), but also the entire transmission circuit (2) can be brought into an optimal state in terms of efficiency in accordance with amplitude variations of the radio frequency signal. As a result, power consumption can be further reduced while dealing with high frequencies.

A communication device (7) according to an eighth exemplary aspect includes the radio frequency circuit (6) according to the seventh aspect and a signal processing circuit (72). The signal processing circuit (72) is configured to output the radio frequency signal to the transmission circuit.

With the communication device (7) according to the eighth aspect, in the power amplifier circuit (1), not only the power supply voltage (V1; V11; V12) for the amplifier element (transistor 21; 21*a*; 21*b*) but also the entire transmission circuit (2) can be brought into an optimal state in terms of efficiency in accordance with amplitude variations of the radio frequency signal. As a result, power consumption can be further reduced while dealing with high frequencies.

A radio frequency module (9) according to a ninth exemplary aspect includes a mounting substrate (90), a power amplifier (20), a control circuit (3), a first terminal (4), and a second terminal (5; 5*a*; 5*b*). The power amplifier (20) is configured to amplify power of a radio frequency signal. The control circuit (3) is configured to control the power amplifier (20). The first terminal (4) is configured to receive a serial data signal. The serial data signal is a signal based on a serial data transmission standard. The second terminal (5; 5*a*; 5*b*) is configured to receive a digital signal different from the serial data signal. The control circuit (3) is configured to perform control in response to the digital signal received from the second terminal (5; 5*a*; 5*b*).

With the radio frequency module (9) according to the ninth aspect, power consumption can be reduced while dealing with high frequencies.

A radio frequency module (9) according to a tenth exemplary aspect, in the ninth aspect, further includes an output matching circuit (27). The output matching circuit (27) is connected to an output side of the power amplifier (20). The output matching circuit (27) is connected to the second terminal (5; 5*a*; 5*b*).

In a radio frequency module (9) according to an exemplary eleventh aspect, in the tenth aspect, the control circuit (3) is configured to control an impedance of the output matching circuit (27) in response to the digital signal.

With the radio frequency module (9) according to the eleventh aspect, gain and power-added efficiency can be further improved.

A radio frequency module (9) according to a twelfth exemplary aspect, in the ninth aspect, further includes a variable capacitance unit (29). The variable capacitance unit (29) is disposed between an input terminal and an output terminal of the power amplifier (20). The variable capacitance unit (29) is connected to the second terminal (5; 5*a*; 5*b*).

With the radio frequency module (9) according to the twelfth aspect, gain and power-added efficiency can be further improved.

In a radio frequency module (9) according to a thirteenth exemplary aspect, in the ninth aspect, the first terminal (4) and the second terminal (5; 5*a*; 5*b*) are adjacent to each other.

In a radio frequency module (9) according to a fourteenth exemplary aspect, in the ninth aspect, the second terminal (5; 5*a*; 5*b*) overlaps the control circuit (3) in plan view in a thickness direction of the mounting substrate (90).

An amplification method according to a fifteenth exemplary aspect includes receiving a power supply voltage (V1; V11; V12) through a power supply line, amplifying a radio frequency signal by using the power supply voltage (V1; V11; V12), and receiving a digital signal different from a serial data signal. The serial data signal is a signal based on a serial data transmission standard.

An amplification method according to a sixteenth exemplary aspect, in the fifteenth aspect, further includes controlling, in response to the digital signal, at least part of a transmission circuit (2) including a power amplifier (20) configured to amplify power of the radio frequency signal.

An amplification method according to a seventeenth exemplary aspect, in the fifteenth aspect, further includes generating the digital signal by using an envelope signal.

In an amplification method according to an eighteenth exemplary aspect, in the seventeenth aspect, the digital signal is a signal for controlling a power amplifier (20) configured to amplify power of the radio frequency signal.

In a radio frequency module (9) according to a nineteenth exemplary aspect, in the ninth aspect, the second terminal (5; 5a; 5b) includes a plurality of second terminals. The plurality of second terminals (5; 5a; 5b) are adjacent to each other.

In the radio frequency module (9) according to the nineteenth aspect, it is possible to reduce variation of the wiring length, thereby realizing a rapid change of a digital signal.

A radio frequency module (9) according to a twentieth exemplary aspect, in the ninth aspect, further includes at least two signal terminals (signal input terminal 91, antenna terminal 63a; 63b). The signal terminals are terminals through which the radio frequency signal passes. The second terminal (5; 5a; 5b) is located between the two signal terminals.

The radio frequency module (9) according to the twentieth aspect is resistant to noise because the second terminal (5; 5a; 5b) is a digital terminal (a terminal to which a digital signal is input). Thus, signal interference between the signal terminals can be reduced in a limited space.

A power supply circuit (73) according to a twenty-first exemplary aspect includes an input terminal, a voltage generator, and an output terminal. The input terminal is configured to receive a power supply control signal. The power supply control signal includes information regarding amplitude variations of a radio frequency signal. The voltage generator is configured to generate a power supply voltage (V1; V11; V12) to be supplied to an amplifier element (transistor 21; 21a; 21b) in response to the power supply control signal received by the input terminal. The amplifier element is configured to amplify power of the radio frequency signal. The output terminal is configured to output the power supply control signal input to the input terminal.

What is claimed:

1. A power amplifier circuit comprising:
   a transmission circuit including an amplifier element configured to amplify power of a radio frequency signal;
   a first terminal configured to receive a serial data signal that is based on a serial data transmission standard;
   a second terminal configured to receive a digital signal that is different than the serial data signal; and
   a control circuit configured to control the transmission circuit in response to the digital signal received from the second terminal.

2. The power amplifier circuit according to claim 1, wherein:
   the transmission circuit further includes an output matching circuit connected to an output side of the amplifier element, and
   the control circuit is configured to control an impedance of the output matching circuit in response to the digital signal received from the second terminal.

3. The power amplifier circuit according to claim 1, wherein:
   the transmission circuit further includes a variable capacitance unit disposed between an input terminal and an output terminal of the amplifier element, and
   the control circuit is configured to control the variable capacitance unit in response to the digital signal received from the second terminal.

4. The power amplifier circuit according to claim 1, wherein the control circuit is configured to control a bias current for the amplifier element in response to the digital signal received from the second terminal.

5. The power amplifier circuit according to claim 4, further comprising:
   a plurality of bias circuits configured to supply the bias current for the amplifier element; and
   a switch configured to switch between the plurality of bias circuits,
   wherein the control circuit is configured to control the switch, in response to the digital signal received from the second terminal, to control the bias current for the amplifier element.

6. The power amplifier circuit according to claim 1, wherein:
   the second terminal is configured to receive a power supply control signal as the digital signal through a path that connects a signal processing circuit and a power supply circuit, the signal processing circuit being configured to output the radio frequency signal to the transmission circuit, the power supply circuit being configured to change an amplitude of a power supply voltage for the amplifier element in response to the power supply control signal from the signal processing circuit, and
   the power supply control signal includes information based on an envelope signal indicating an envelope of an amplitude of the radio frequency signal, and is output from the signal processing circuit to the power supply circuit to change the amplitude of the power supply voltage.

7. A radio frequency circuit comprising:
   the power amplifier circuit according to claim 1;
   an antenna terminal; and
   a filter disposed in a path that extends between the power amplifier circuit and the antenna terminal.

8. A communication device comprising:
   the radio frequency circuit according to claim 7; and
   a signal processing circuit configured to output the radio frequency signal to the transmission circuit.

9. A radio frequency module comprising:
   a mounting substrate;
   a power amplifier configured to amplify power of a radio frequency signal;
   a first terminal configured to receive a serial data signal that is based on a serial data transmission standard;
   a second terminal configured to receive a digital signal that is different than the serial data signal; and
   a control circuit configured to control the power amplifier in response to the digital signal received from the second terminal.

10. The radio frequency module according to claim 9, further comprising an output matching circuit connected to an output side of the power amplifier and to the second terminal.

11. The radio frequency module according to claim 10, wherein the control circuit is configured to control an impedance of the output matching circuit in response to the digital signal received from the second terminal.

12. The radio frequency module according to claim 9, further comprising a variable capacitance unit disposed between an input terminal and an output terminal of the power amplifier and that is connected to the second terminal.

13. The radio frequency module according to claim 9, wherein the first terminal is adjacent to the second terminal.

14. The radio frequency module according to claim 9, wherein the second terminal overlaps the control circuit in a plan view in a thickness direction of the mounting substrate.

15. The radio frequency module according to claim 9, wherein the second terminal comprises a plurality of second terminals that are adjacent to each other.

16. The radio frequency module according to claim 9, further comprising:
   at least two signal terminals through which the radio frequency signal passes,
   wherein the second terminal is located between the two signal terminals.

17. An amplification method comprising:
   receiving a power supply voltage through a power supply line;
   amplifying a radio frequency signal by using the power supply voltage; and
   receiving a digital signal that is different than a serial data signal that is based on a serial data transmission standard.

18. The amplification method according to claim 17, further comprising controlling, in response to the digital signal, at least part of a transmission circuit including a power amplifier configured to amplify power of the radio frequency signal.

19. The amplification method according to claim 17, further comprising generating the digital signal based on an envelope signal.

20. The amplification method according to claim 19, further comprising controlling, by the digital signal, a power amplifier configured to amplify power of the radio frequency signal.

* * * * *